United States Patent [19]

Masuda et al.

[11] Patent Number: 5,576,997
[45] Date of Patent: Nov. 19, 1996

[54] DATA PROCESSING SYSTEM AND SEMICONDUCTOR MEMORY SUITED FOR THE SAME

[75] Inventors: Noboru Masuda, Tokorozawa; Kazunori Nakajima, Kokubunji; Hideo Maejima, Hitachi, all of Japan

[73] Assignee: Hitachi, Ltd., Tokyo, Japan

[21] Appl. No.: 309,418

[22] Filed: Sep. 20, 1994

[30] Foreign Application Priority Data

Sep. 20, 1993 [JP] Japan .................................... 5-232831

[51] Int. Cl.⁶ ................................................ G11C 13/00
[52] U.S. Cl. ............................ 365/189.04; 365/230.03
[58] Field of Search ............................. 365/154, 189.01, 365/189.04, 189.05, 23.01, 230.03

[56] References Cited

U.S. PATENT DOCUMENTS 5,289,403  2/1994  Yetter ......................................... 365/49
5,452,260  9/1995  Matsui et al. ...................... 365/230.03

OTHER PUBLICATIONS

*Hewlett–Packard Journal,* "LSI Circuits for Low–End and Midrange PA–RISC Computers, by "C. A. Gleason, et al., Aug. 1992.

*Primary Examiner*—Terrell W. Fears
*Attorney, Agent, or Firm*—Antonelli, Terry, Stout & Kraus

[57] ABSTRACT

A data processing system having a logic LSI, a plurality of memory LSIs and a circuit which eliminates delays in the time at which data read out form the memory LSIs reach the logic LSI. The circuit includes variable delay circuits for delaying the data signals read out of the memory LSIs. A control circuit start monitors the time when the data read out of the individual memory LSIs arrive at flip-flops which output the data to the logic LSI. The delay times in the variable delay circuits are controlled by the control circuit for the individual memory LSIs so that the times the data read out from the memory LSIs reach the logic LSI may coincide with a predetermined standard time. Thus, the read data from the individual memory LSIs are caused to reach the flip-flops simultaneously.

46 Claims, 20 Drawing Sheets

DATA PROCESSING SYSTEM AND SEMICONDUCTOR MEMORY SUITED FOR THE SAME

BACKGROUND OF THE INVENTION

The present invention relates to a data processing system comprising a plurality of memory LSIs connected with a common address bus and a processor for making accesses to the memory LSIs. More particularly, the present invention relates to a data processing system having a memory data output circuit which delays the output of data read out from the memory circuits so that the data is supplied to this processor at the same time.

In a conventional data processing system for storing data discretely in a plurality of memory LSIs, in order to realize a memory capable of writing or reading data of a large bit number at a high speed, the memory to be accessed by the processor is composed of a plurality of memory LSIs. The data to be held by the memory are divided into a plurality of bit portions, which are divided into the same addresses of the plurality of memory LSIs and stored therein in parallel. When the written data are to be read out, their different bit portions are read out in parallel from the plurality of memory LSIs.

Specifically, these memory LSIs are connected through a common address bus with the processor so that they are fed with a common address. The write data have their different bit portions fed to the individual memory LSIs from the flip-flops, which are so disposed in the processor as to correspond to the individual memory LSIs, through the data buses which are disposed to correspond to the individual memory LSIs.

Upon reading the data, the common read address is fed through the aforementioned address bus from the processor. The different bit portions of the data to be read are read out of the memory LSIs in parallel and are transmitted in parallel through the aforementioned data bus to the aforementioned plurality of flip-flops so that they are fetched by the flip-flops in synchronism with the clock signal in the processor. This processor uses the different bit portions as the information composing one data.

In this prior art (hereinafter "first prior art"), when the processor has its operating clock increased in frequency, the distance between each memory LSI and the processor cannot be neglected since it creates a problem that the data cannot be normally read out. Specifically, for the memory LSI closest to the processor and the memory LSI most remote from the processor, there is a difference between the time periods required for the address signal to reach those memory LSIs from the processor and the time periods required for the data read out of those memory LSIs to reach the processor.

Thus, when a second address for reading out second data is sent out at a second clock timing after a first address for reading out first data is sent out at a first clock timing to the address bus the following occurs. After a certain bit portion, to which belong second data read out from the closest memory LSI, has reached the processor and before a portion in the second data read out of the remotest memory LSI reaches the processor, the bit portion, to which belong the second data read out of the closest memory LSI, may possibly reach the processor.

As a result, if the data from the memory LSIs are latched in the aforementioned plurality of flip-flops in response to the clock signal generated in the processor, they cannot be used as normal ones. In order to eliminate such problem, it is necessary to reduce the frequency of the operating clock of the processor or to elongate the time interval at which the address to be sent out is switched. Thus, the aforementioned first prior art cannot be used for high-speed operation.

When the operating speed of the processor is not so high, a similar problem also arises if the number of the memory LSIs increases. A trial for solving such problem is disclosed in FIG. 3 of page 14 of Hewlett-Packard Journal issued in August, 1992 (hereinafter "second prior art"). This second prior art is different from the above-specified first prior art in that the timings, at which the data read out of the individual memory LSIs are fetched in the aforementioned flip-flops, are different for the individual memory LSIs. Specifically, the delay time for the remote memory LSI is made smaller than that for the close memory LSI so that the data read out of the close memory LSI may be fetched at a delayed timing.

More specifically, circuits for delaying the clocks are disposed for and close to the individual memory LSIs and are fed with the clock signals from the processor through the common control signal bus so that the delayed clock signals are fed from those delay circuits to the corresponding flip-flops through the signals lines for the individual delay circuits. The LSIs of the individual delay circuits have their delay times set such that the delay time corresponding to the remote memory LSI is shorter than that for the close memory LSI.

Although this second prior art can be better used for the processor operating at a higher speed than the aforementioned first prior art it still suffers from other disadvantages. It has been predicted that in the future the operating speed of the processor will further increase. The aforementioned second prior art is note effective when used with processors of the future that operate at higher speeds.

According to the second prior art, however, the delay time of the clock for fetching the data read out of the closest memory LSI is made longer than that of the clock for fetching the data from another memory LSI. Since, the data read out of the closest memory LSI have to be fetched at each clock by the corresponding flip-flop, the delay time of the clock for fetching the data read out of the closest memory LSI cannot be longer than the operating period of the processor. As a result, for example, after the first address for reading the first data has been sent out to the address bus at a first clock timing, a second address for reading out second data is sent out at a subsequent second clock timing. In this case, the data read out of the remotest memory LSI may possibly fail to reach the corresponding flip-flop even at the end of the timing at which the bit portion, to which belong the second data read out of the closest memory LSI, is to be fetched by the corresponding flip-flop.

Thus, the second prior art cannot be used for the higher-speed processors.

SUMMARY OF THE INVENTION

A first object of the present invention is to provide a data processing system which can use a memory in a processor operating at a shorter clock period.

A second object of the present invention is to provide a memory which is suited for such data processing system.

A third object of the present invention is to provide a data processing system having a memory data output circuit which delays the output of data read out from memory circuits so that data is supplied to the processor at the same time.

In the data processing system according to the present invention, there is provided in a data transmitting path from each of a plurality of memories to a processor a variable delay circuit for delaying the data signals read out of the memories individually for the memories so that the data may reach the processor at an equal timing.

More specifically, the timings, at which the data read out of the individual memories reach the processor, are compared with a predetermined standard timing so that the read data are delayed to eliminate any differences. As a result, the timings at which the data read out of the plurality of memories reach the processor are equalized to each other.

The present invention also provides a memory data output circuit for outputting data read out from a plurality of memories at substantially the same time in a data processing system which includes a processor, a plurality of memories, an address bus for transmitting addresses fed from the processor to the memories and a plurality of data buses provided individually for the memories for transmitting a plurality of data fed from the processor in parallel to the memories and for transmitting a plurality of data read out of the memories in parallel to the processor.

The memory data output circuit of the present invention includes a plurality of transmission circuits provided individually for the memories for transmitting from the memories via the data buses to the processor a plurality of data read out of the memories with adjustable delay times and a control circuit which adjusts delay times of the plurality of transmission circuits in response to the timing at which the outputs of the plurality of transmission circuits change.

The present invention further provides a semiconductor memory having means for arranging the timings at which output signals change, means for detecting that an address signal has changed, and means for enabling the arranging means a predetermined time after the address signal has changed.

Since timings at which the data read out of the plurality of memories reach the processor are equalized to each other in the data processing system according to the present invention, the omission of detection, which might otherwise be caused due to the difference in the distances between the processor and the plurality of memories, can be eliminated even though the operating clock of the processor is increased to a high speed.

BRIEF DESCRIPTION OF THE DRAWINGS

The improvements of the present invention and the advantages resulting therefrom will become apparent upon reading the following description of the preferred embodiments in light of the drawings in which like parts are designated with like numerals and in which:

FIG. 3 is a circuit diagram showing the construction of a variable delay circuit to be used in the embodiment of FIG. 1 and so on;

FIG. 15 is a circuit diagram showing one embodiment a synchronizing circuit to be used in the embodiment of FIG. 14 and so on;

DETAILED DESCRIPTION OF THE PREFERRED EMBODIMENT

Figure 1:
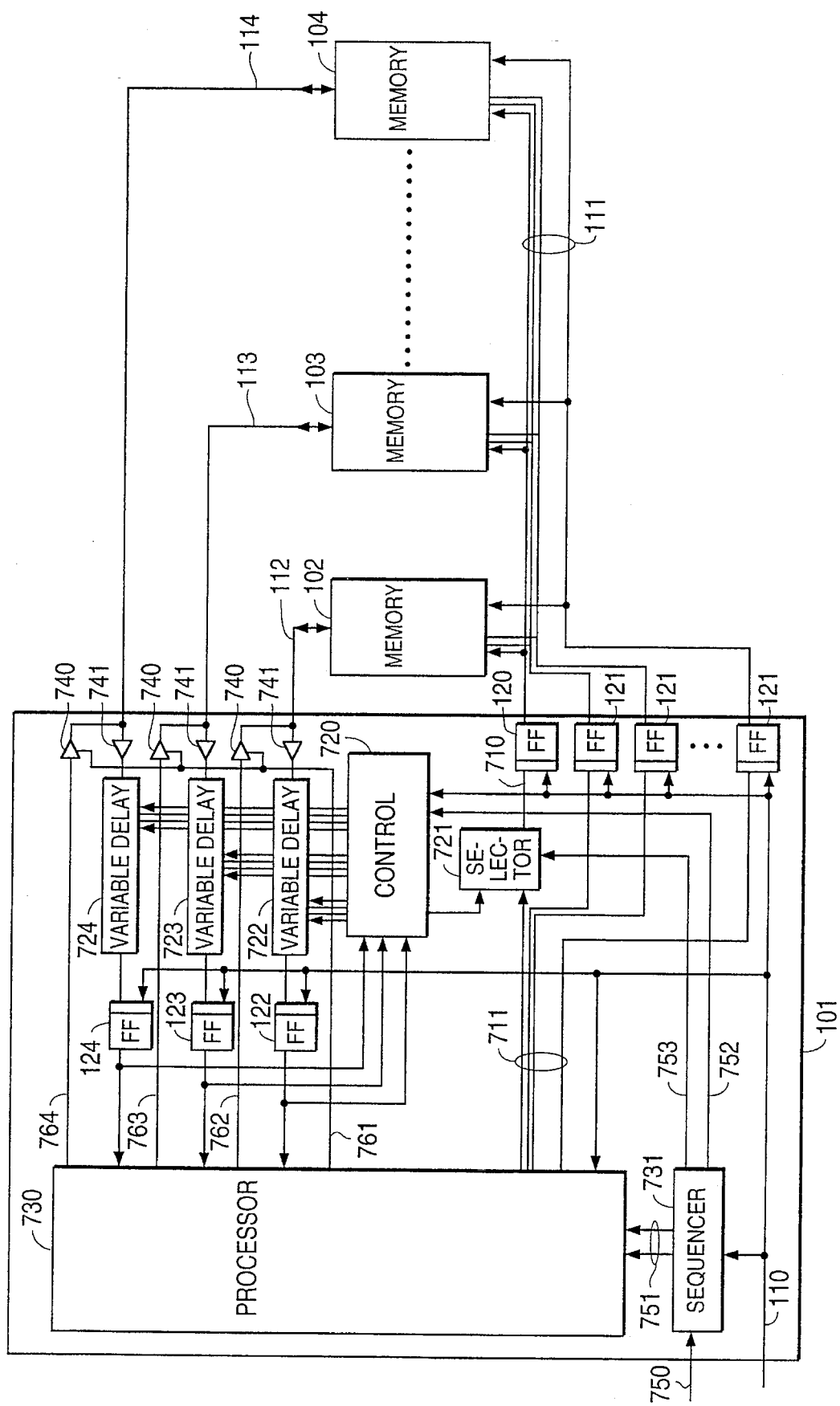
FIG. 1 is a circuit diagram showing one embodiment of the present invention.

FIG. 1 is a circuit diagram showing the construction of a data processing system according to one embodiment of the present invention. In FIG. 1, reference numeral 101 designates a logic LSI including a portion (as will be called the "processor unit") 730 having a processor function, and numerals 102 to 104 designate memory LSIs to be used by the logic LSI, of which the memory LSI 102 is the closest to the logic LSI 101 whereas the memory LSI 104 is the remotest from the same. These memory LSIs are used for dividing the data to be used by the processor unit 730 into three bit portions and for latching them in address positions designated by the processor unit 730. The outputs of the individual memory LSIs hereinafter will be merely called "data". In the present embodiment, the memories to be used by the processor unit 730 are exemplified by the three memory LSIs for the purpose of simplicity, but the present invention should not be limited thereto.

Numeral 111 designates an address bus common among the memory LSIs for transmitting an address signal from the logic LSI 101 to those LSIs, and numerals 112 to 114 designate data buses which are individually provided for the memory LSIs 102 to 104 for transmitting the data signals read out of the memory LSIs to the logic LSI 101. Numeral 740 designates a data writing driver for each data bus. This driver 740 is adapted to be turned ON only when the data are to be written in response to an output 761 from the processor unit 730. Numeral 741 designates an input buffer which is provided for each data bus for the read data.

Numerals 722 to 724 designate variable delay circuits for delaying the data read out of the memory LSIs 102 to 104, and numerals 122 to 124 designate flip-flops for fetching the data fed from the variable delay circuits 722 to 724 in synchronism with the operating clock signal of the logic LSI 101. In this embodiment, these flip-flops 122 to 124 used are exemplified by the (hereinafter "edge trigger type") flip-flops for fetching input signals in synchronism with the fall of the clock signal. The outputs of those flip-flops are fed to the processor 730.

Numeral 720 designates a control circuit for adjusting the delay times of the variable delay circuits 722 to 724. Numeral 120 designates a flip-flop for feeding a specific one bit of the address to be fed to the bus 111 in synchronism with the clock, and numeral 121 designates a flip-flop group for feeding the address bits other than the specific one bit in synchronism with the clock.

A selector 721 is provided for feeding either the specific address bit outputted from the control circuit 720 or the specific address bit fed from the processor unit 730 selectively to flip-flop 120. Moreover, numeral 731 designates a sequencer for outputting signals for controlling the operations of the control circuit 720 and the processor 730.

In the present embodiment, the output data from the aforementioned memory LSIs 102 to 104 are delayed by the variable delay circuits 722 to 724 and fed at the same timing to the flip-flops 122 to 124. As a result, the data from those memory LSIs can be normally read out irrespective of the difference in the distances between the aforementioned pluralities of memory LSIs and logic LSI. The delay times of the variable delay circuits 722 to 724 are automatically determined by the control circuit 720.

The control circuit 720 performs an operation such that when the data from the aforementioned memory LSIs arrive at the flip-flops 122 to 124 within an allowable range, as viewed from the instant when the standard signal produced by the control circuit 720 changes. For this operation, the aforementioned control circuit 720 monitors the change in the outputs of the flip-flops 122–124 and compares the timing for the outputs to change and the timing for the level of the standard signal to change. Thus, the control circuit 720 determines the instant at which data is output to the processor unit by increasing or decreasing the aforementioned delay times till the two timings described above become coincident. Moreover, the setting of the delay time is accomplished for the different addresses in the memory LSIs. Also the determination of the delay time is automatically accomplished before the ordinary operation of the processor unit 101.

The remaining characteristics of the present embodiment will be described in detail in the following.

When a reset signal is inputted to a terminal 750 immediately after the power is supplied, the sequencer 731 instructs the processor unit 730 to write the initial data through lines 751. In addition, a signal for selecting the output of the processor unit 730 is outputted as a control signal 753 to be fed to the selector 721. In response to the aforementioned instruction, the processor unit 730 writes the first initial data in specific addresses of all the memory LSIs 102 to 104.

Specifically, the processor unit 730 sends out the first address signal for designating the address to the line 711, divides the first initial data to be written together into a plurality of bit portions for the individual memory LSIs 102 to 104, and sends out them in parallel to the plurality of drivers 740 for the memory LSIs 102 to 104. In addition, the processor unit 730 turns ON the driver enable signal 761. These bit portions are fed through the buses 112 to 114 to the memory LSIs 102 to 104.

A specific bit in the first address signal is selected by the selector 721 and set in the flip-flop 120, whereas the remaining bits in the address signal are set in the flip-flop group 121. The addresses thus latched in the flip-flops 120 and 121 are fed through the bus 111 from the memory LSIs 102 to 104. Thus, the initial data are separately stored in the individual first addresses of the memory LSIs 102 to 104. Incidentally, in the present embodiment, the signal outputted by the processor unit 730 and indicating the demand for the writing operation is not shown for the purpose of simplicity. It is assumed that the memory LSIs 102 to 104 read out the memory position designated by the address bus 111 when no write demand is inputted.

It is assumed that first initial data used are expressed in the form of "000..0". Moreover, the value of the aforementioned first address is predetermined by the processor unit 730. It has a relation to the operation of the system of the present embodiment whether the value of the aforementioned specific bit of the first address signal takes the value "0" (hereinafter "even mode") equal to that of each bit of the initial data or the different value "1" (hereinafter the "odd mode"), as will be described below. The present embodiment that it is designated by the sequencer 731 which value is to be used. In the present embodiment, it is assumed that the value "0" equal to each bit of the initial data is used as the aforementioned specific bit, that, the sequencer 731 designates the even mode in the processor unit 730.

Next, after the end of the writing operation of the first initial data, the processor unit 730 changes the aforementioned specific bit of the first address signal into the value "1" and likewise writes the form "111..1" as the second initial data in a changed second address position. After this end of the writing operation of the second initial data, the sequencer 731 instructs the processor unit 730 to stop the writing operation through the line 751. In response to this instruction, the processor unit 730 stops the issue of the demand for the writing operation and waits in the stand-by state having outputted the second address.

The sequencer 731 further sends an enable signal 752 to enable the control circuit 720. In addition, the sequencer 731 outputs a signal for selecting the output of the control circuit 720 as a control signal 753 to be fed to the selector 721. When the control circuit 720 is enabled, it outputs a signal having a value varying between "0" and "1" as the aforementioned specific bit in the address signal. This bit is selected by the selector 721 and fed to the bus 111 through the flip-flop 120. As a result, the address on the bus 111 repeatedly changes between the aforementioned first and second addresses.

As a result, the processor unit 730 stops the feed of the write demand, the memory LSIs 102 to 104 read out the first initial data from the positions of their first addresses and output them to the buses 112 to 114 when the address of the bus 111 becomes the first address. Thus, the first initial data "000..0" are outputted to those buses. After this, when the address of the address bus 111 changes to the second address, the memory LSIs 102 to 104 read out the second initial data from the positions of their individual second addresses. The second initial data "111..1" are outputted to the buses 112 to 114.

If the changing period of the specific address bit outputted by the control circuit is delayed more than that of the operating clock of the logic LSI, the data to be read out of the memory LSIs 102 to 104 change for the same period. The data thus read are sent through the signal lines 112 to 114 to the variable delay circuits 722 to 724, the outputs of which are fetched by the flip-flops 122 to 124 and returned to the control circuit 720. Thus, the outputs of these flip-flops change between the values "0" and "1". However, the instants at which those outputs change are different depending upon the positions of the memory LSIs 102 to 104.

In the control circuit 720, on the other hand, there is generated a standard signal which changes at a predetermined timing expected as a timing for the data to return. Then, the delay times of the variable delay circuits 722 to 724 are so adjusted that the output signals of the flip-flops 122 to 124 may be compared with the standard signal to coincide thereto. Since these adjustments are accomplished at every repetition of the reading operations of the aforementioned first and second initial data, all the outputs of the flip-flops 122 to 124 change at the same timings as that of the standard signal after lapse of a sufficient time period.

After this, the sequencer 731 stops the feed of the enable signal 752 to the control circuit 720. As a result, the control circuit 720 stops updating the delay times by the variable delay circuits 722 to 724. The sequencer 731 further informs the processor unit 730 of the end of the initial setting through the line 751 and changes the control signal 753 for the selector 721 to select the output of the processor unit 730.

Figure 2:
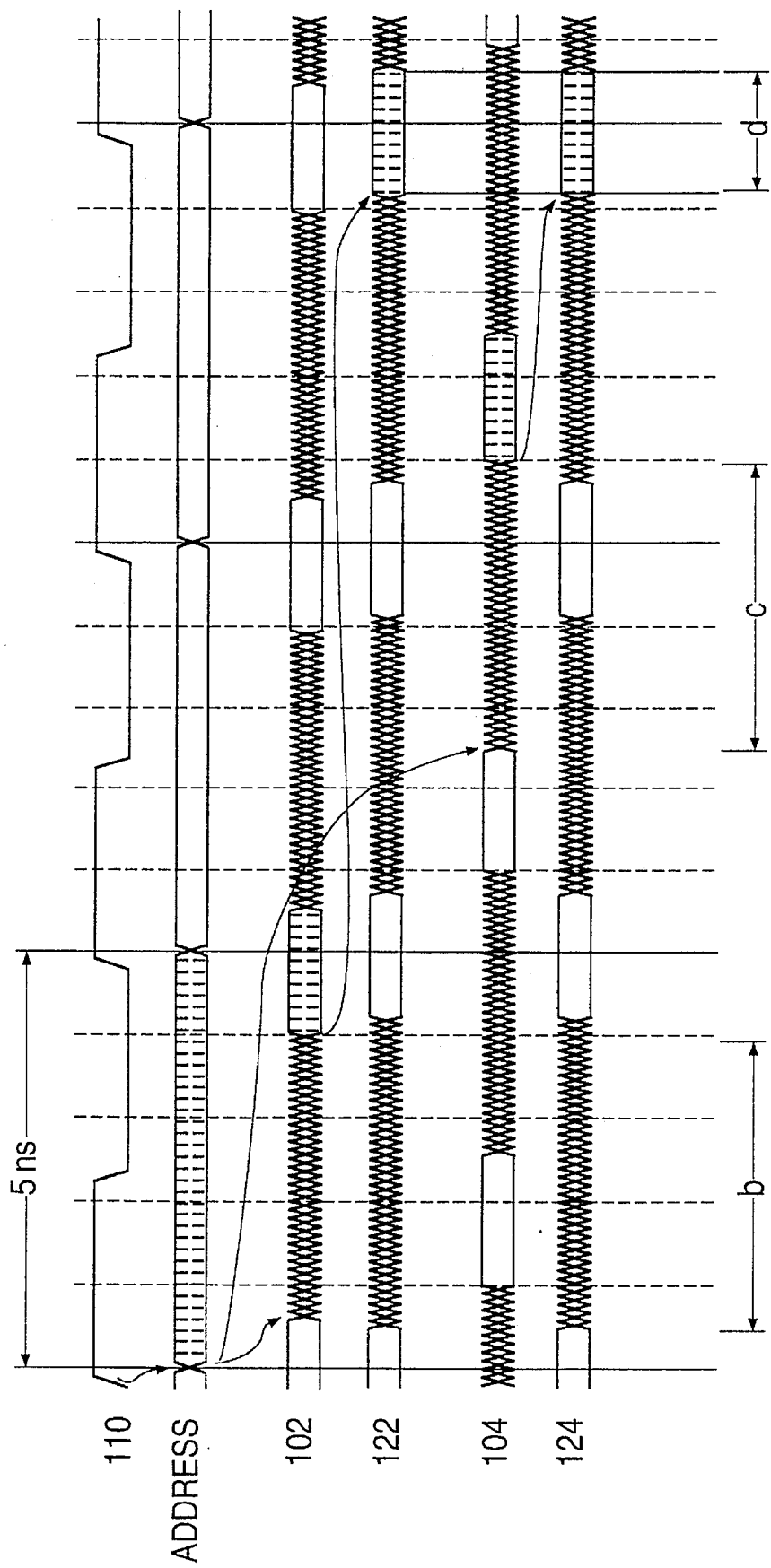
FIG. 2 is a timing chart showing the operations of the embodiment of FIG. 1.

In response to the information of the aforementioned end, the processor unit 730 starts its normal operations. After this, the processor unit 730 makes accesses to the memory LSIs 102 to 104. Thus, all the time periods from the time when the processor unit 730 outputs the address signal and to the time when the data are returned are within a predetermined time period for every memory LSIs 102 to 104. This operation is shown in FIG. 2. As a result, even if the processor unit 730 outputs a plurality of read demands for a short period, the data demanded by the individual demands can be read out of the memories.

In FIG. 1, it is assumed as to the delay times of the portions of the memory LSIs 102 to 104 and the wiring group 111 to 114: that the time period for the address signal to be transmitted from the logic LSI 101 to the closest memory LSI 102 is about 0 ns; that the time period for the same to be transmitted to the remotest memory LSI 104 is about 4 ns; that the time period for the data signal to be transmitted from the closest memory LSI 102 to the logic LSI 101 is about 0 ns; that the time period for the same to be transmitted from the remotest memory LSI 104 is about 3 ns; that the time period from the time when the address signals to be inputted to the memory LSIs 102 to 104 change to the time when the data signals to be outputted therefrom begin changing is no shorter than about 0.5 ns; and that the time period till the same are fixed is no longer than about 4 ns.

The timing relations after the adjustments of the delay times of the variable delay circuits 722 to 724 have been ended are shown in FIG. 2. As shown, the instants when the data signals returned from the memory LSIs 102 to 104 begin changing and are fixed are 0.5 ns at the earliest and 11 ns at the latest after the address signals have changed, so that the data may possibly change for the time period of about 10.5 ns. In the embodiment of FIG. 1, however, because of the adjustments by the variable delay circuits 722 to 724, the instants when the signals to reach the flip-flops 122 to 124 begin changing and are fixed are, respectively, after about 10.5 ns and 14 ns so that the time period for the data to possibly change can be suppressed to about 3.5 ns. As a result, all the data can be correctly fetched for the time interval of 5 ns even if the address signals are switched at the interval of 5 ns.

Figure 4:
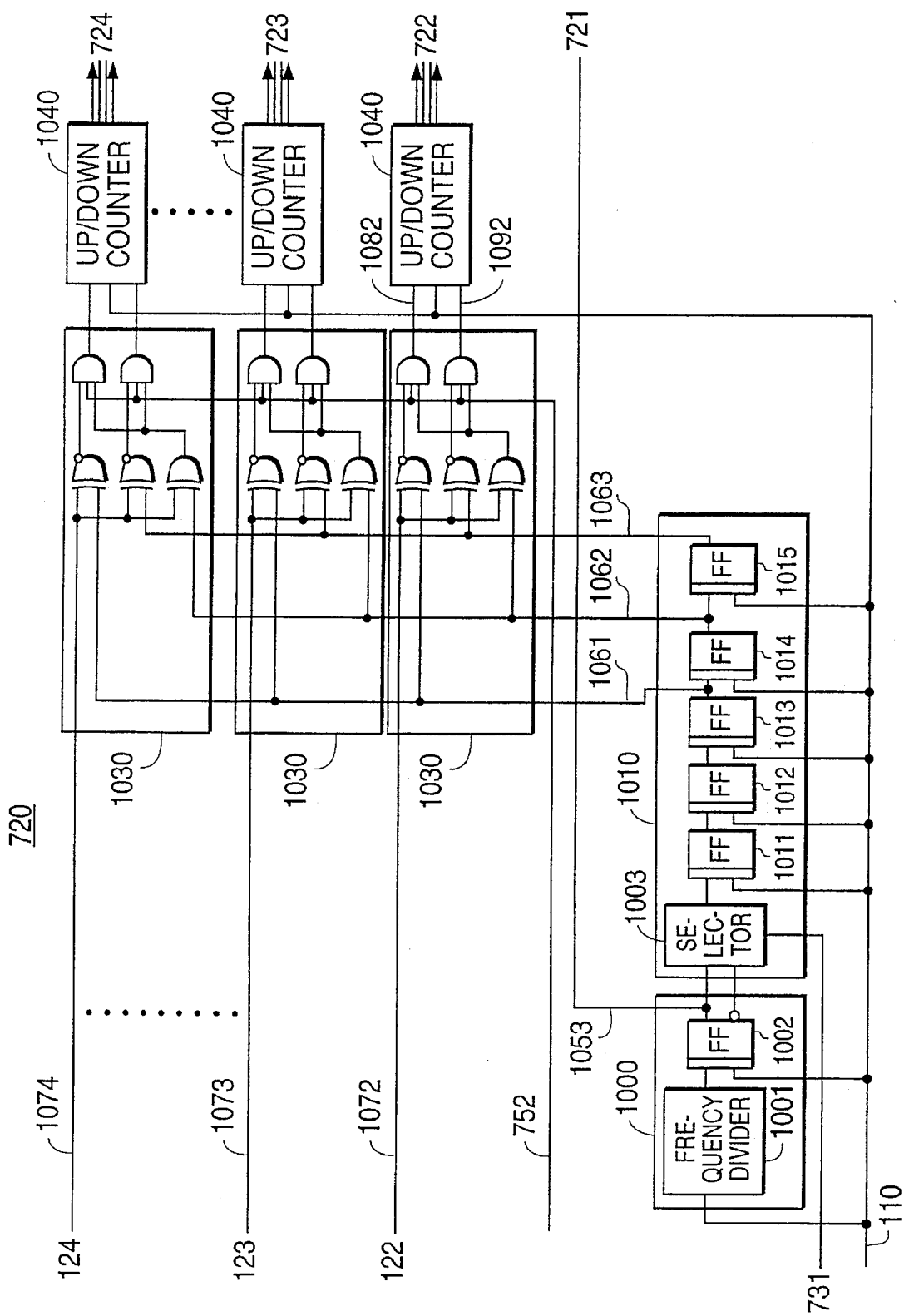
FIG. 4 is a circuit diagram showing the construction of a control circuit to be used in the embodiment of FIG. 1.

FIG. 4 shows a construction of the control circuit 720. In FIG. 4, reference numeral 1000 designates a circuit for generating a specific address bit 1053 of a memory address to be accessed to, at the time of setting the delay time initially, and for feeding it to the selector 721 (of FIG. 1). This circuit 1000 is constructed to include a frequency divider 1001 for dividing the frequency of an operating clock signal 110 of the logic LSI 101 (of FIG. 1), and a flip-flop 1002 for fetching the output of the frequency divider 1001 in synchronism with the rise of the clock signal 110 and for outputting it as the specific address bit 1053.

In the present embodiment, the frequency divider 1001 divides the frequency of the clock 110 into sixteen. Therefore, the specific address bit 1053 changes in its value from 0 to 1 or from 1 to 0 for every eight periods of the clock signal 110. As a result, at the initial setting operation, the same in-memory positions of the memory LSIs 102 to 104 can be repeatedly accessed to for the eight periods. Meanwhile, the remaining in-memory positions are accessed to after each lapse of the eight periods so that the output signals of the flip-flops 122 to 124 change after the delay times for those in-memory positions. The present invention should not be limited to sixteen divisions of the frequency by the frequency divider 1001.

Numeral 1010 designates a circuit for generating a standard signal 1062, which changes at the instant expected as the timing for the output signals of the flip-flops 122 to 124 to change, and an early signal 1061 and a delayed signal 1063, which change before and after the standard signal by one clock. The signal generating circuit 1010 is constructed to include a selector 1003 for selecting one of the non-inverted and inverted outputs of the divider of the flip-flop 1002 in response to the select signal fed by the sequencer 731 (of FIG. 1), and five flip-flops 1011 to 1015 connected in tandem for responding to the clock signal 110. These flip-flops 1011 to 1015 constitute altogether a shift register for shifting the frequency-divided signal selected by the selector 1003, in response to the clock signal 110. The standard signal 1062, the early signal 1061 and the delayed signal 1063 are outputted from the fourth, third and fifth stage flip-flops 1013, 1014 and 1015, respectively. As a result, the early signal 1061 has its level changed one period before the standard signal 1062, and the delayed signal 1063 has its level changed one period after the standard signal. All these three signals are those which have their levels unchanged for eight periods.

The number of the flip-flops 1011 to 1015 and the position of the flip-flop for fetching the standard signal 1062 are so predetermined that the standard signal 1062 has its level changed in the vicinity of the instant when the data read out of the remotest memory LSI 104 are expected to be outputted after they arrive and are fetched by the flip-flop 124 (of FIG. 1), in case the data are delayed by substantially the minimum delay time by the variable delay circuit 724 of FIG. 1.

The control signal for controlling which of the non-inverted and inverted outputs of the flip-flop 1002 is to be selected by the selector 1003 in the standard signal generating circuit 1010 is given by the sequencer 731 of FIG. 1. When the non-inverted output is used, a signal having its level changed from 0 to 1 at a predetermined timing is used as the standard signal 1062 or the like. Otherwise, this standard signal 1062 is exemplified by one which changes inversely at that timing. This control is necessary because the timing for changing the outputs of the flip-flops 122 to 124 to be detected is related to whether it is the timing for changing the level from 0 to 1 or from 1 to 0, depending upon whether the writing of the initial data is in the even or odd mode.

Depending upon whether the value of the initial first data to be written by the processor unit 730 and the value of the specific bit of the first address should be in even or odd polarity, it is determined by the sequencer 731 whether the control signal is at 1 or 0. The value of this control signal is assumed to be at 1 in the present embodiment because it has been assumed that the even polarity is adopted, as described above.

Numeral 1030 designates a comparator which is provided for each of the memory LSIs 102 to 104. This comparator 1030 compares the aforementioned signals 1061 to 1063 with some of the outputs 1072 to 1074 of those of the flip-flops 122 to 124, which receive the data signals corresponding to the memory LSIs, and outputs an UP signal 1082 or a DOWN signal 1092 on the basis of the comparison result. Numeral 1040 designates an UP/DOWN counter which is provided for each comparator 1030 for increasing/decreasing the counted value in response to the UP signal 1082 or the DOWN signal 1092 from the corresponding comparator. Each counter has a circuit packaged therein for decoding the counted value to generate a control signal having a bit array having the value 1 at its less significant side of a number equal to that counted value. This control signal is used as one for each of the variable delay circuits 722 to 724 of FIG. 1. These decode circuit and control signals will be described hereinafter.

Numeral 752 designates the counter enable signal fed from the sequencer 731 of FIG. 1. The UP/DOWN counter 1040 continues its counting operation, while the signal 752 is at the high level, but maintains its counted value of that time when the same signal takes the low level.

Figure 7:
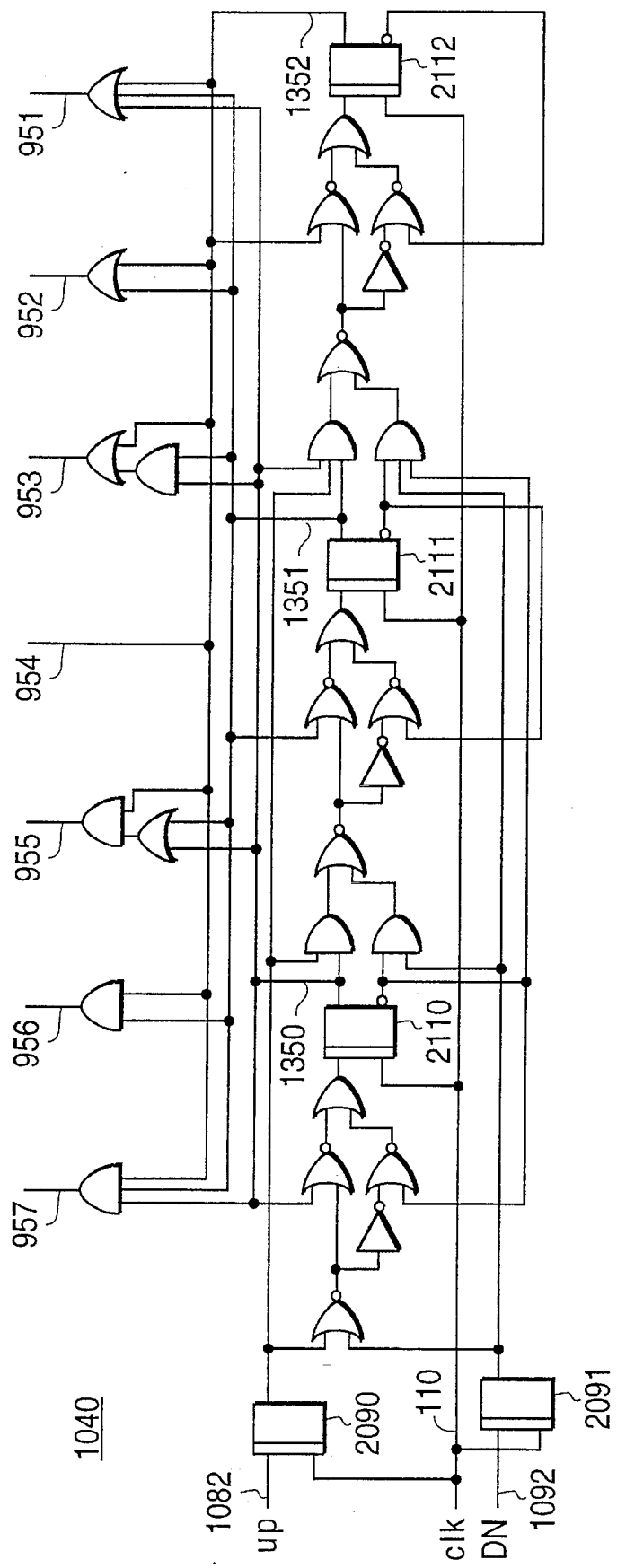
FIG. 7 is a circuit diagram showing one embodiment of an UP/DOWN counter to be used in the control circuit of FIG. 4.

One example of the construction of the UP/DOWN counter 1040 is shown in FIG. 7. As shown, this counter 1040 is constructed to include two flip-flops for fetching the count-up signal 1082 and the count-down signal 1092 in response to the clock signal 110; a group of gates for counting operations on the basis of the outputs of those flip-flops; three flip-flops for latching the three bits indicating the counted result; and a group of gates for decoding the individual bits 1350 to 1352 of the binary counted values outputted from those flip-flops to generate control signals 951 to 957 to be fed out to the variable delay circuit 722 (of FIG. 1). The relations between the binary counted values 1350 to 1352 and the control signals 951 to 957 are enumerated in Table 1.

TABLE 1

| Signal line | Counted Number | | | | | | | |
|---|---|---|---|---|---|---|---|---|
|  | 0 | 1 | 2 | 3 | 4 | 5 | 6 | 7 |
| 1350 | L | H | L | H | L | H | L | H |
| 1351 | L | L | H | H | L | L | H | H |
| 1352 | L | L | L | L | H | H | H | H |
| 951 | L | H | H | H | H | H | H | H |
| 952 | (L) | L | H | H | H | H | H | H |
| 953 | (L) | (L) | L | H | H | H | H | H |
| 954 | (L) | (L) | (L) | L | H | H | H | H |

TABLE 1-continued

| Signal line | Counted Number | | | | | | | |
|---|---|---|---|---|---|---|---|---|
|  | 0 | 1 | 2 | 3 | 4 | 5 | 6 | 7 |
| 955 | (L) | (L) | (L) | (L) | L | H | H | H |
| 956 | (L) | (L) | (L) | (L) | (L) | L | H | H |
| 957 | (L) | (L) | (L) | (L) | (L) | (L) | L | H |

In this circuit, the values indicated by the binary counted values 1350 to 1352 do not change while both the count-up signal 1082 and the count-down signal 1092 are at the low level. When the count-up signal 1082 takes the high level, the values indicated by the binary counted values 1350 to 1352 are incremented by one count after the two cycles. The circuit is further constructed such that when the count-down signal 1092 takes the high level the numerical values indicated by the binary counted values 1350 to 1352 are decremented by one count after the two cycles. Furthermore, when the counted number is "0", that is when all the signals appearing at the terminals of the counted values 1350 to 1352 are at the low level, all the signals 951 to 957 take the low level so that they take the high level sequentially from the signal 951 at each advance of one count until all of them take the high level when the counted value is "7".

All of the variable delay circuits 722 to 724 have the identical construction and can be exemplified by the circuit which is disclosed in Japanese Patent Application No. 241723/1992. The variable delay circuit 722 using one example of the Application is shown in detail in FIG. 3.

Figure 3:
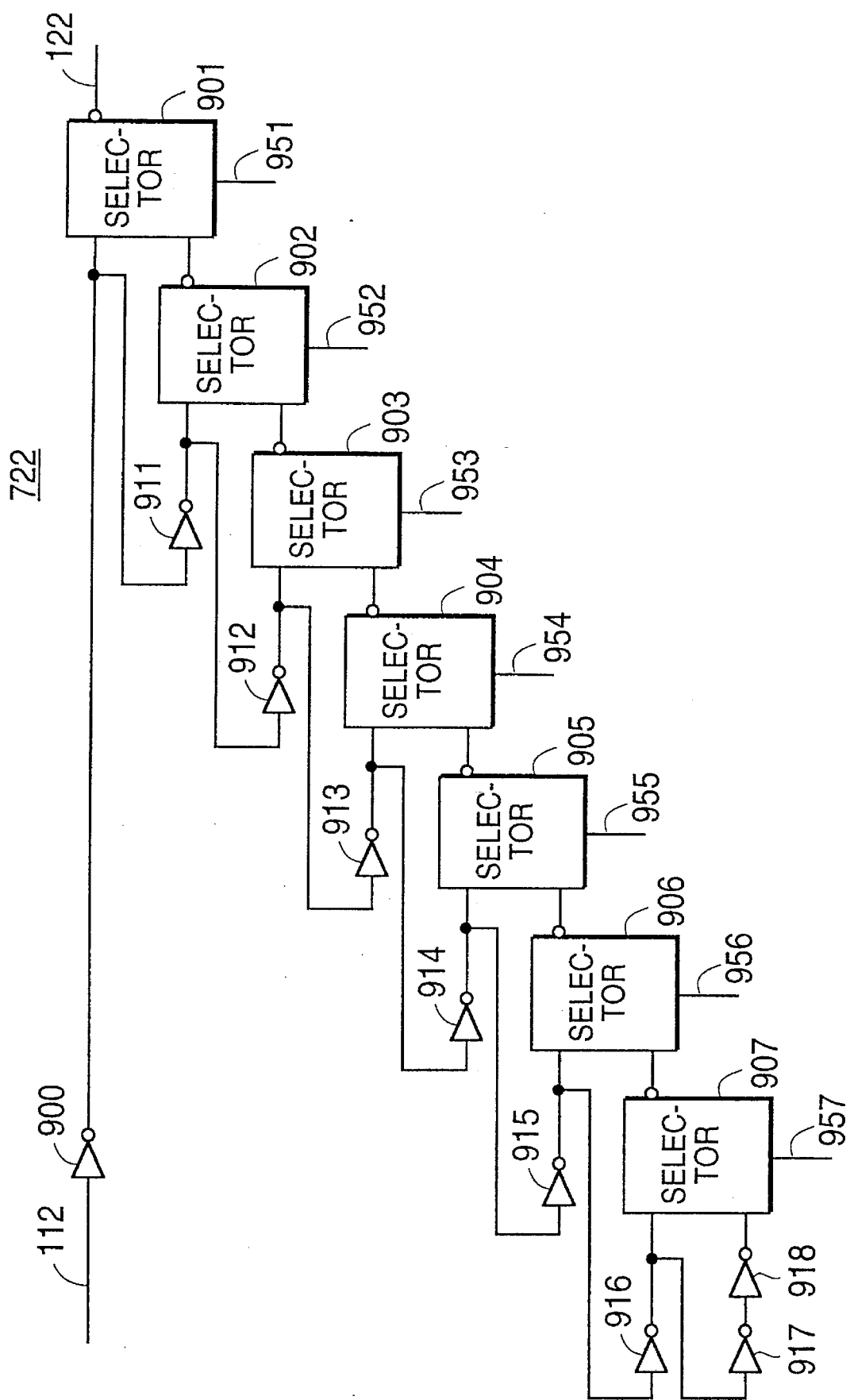

In FIG. 3: numeral 900 designates an input buffer for receiving the data signal read out of the memory LSI 102 of FIG. 1; numerals 911 to 918 designate gate circuits connected in tandem for delaying the data signal; and numerals 901 to 907 designates selectors for selecting one of the output of any of the gate circuits and the output of another selector. However, the first selector 901 selects one of the output of the selector for selecting the output of the first gate circuit 911 and the output of the input buffer 900. The selectors 901 to 907 are individually adapted to select, when the control signals 951 to 957 individually for them take the values 0 and 1, the upper input of the drawing (i.e., the input having a shorter delay time) and the lower input of the drawing (i.e., the input having a longer delay time), respectively.

In this delay circuit, the delay time from the time when the input buffer 900 receives the data signal to the time when the selector 901 outputs its signal can be changed by changing the control signals 951 to 957 of the individual selectors 901 to 907. Specifically, the delay time is the longest, when all the selectors 901 to 907 select the lower signals of the drawing (i.e., when the control signal is "1111111"), and grows shorter each time the selectors 907 to 901 select the upper signals of the drawing sequentially. The delay time grows the shortest when the selector 901 selects the upper signal of the drawing (i.e., when the control signal is "0000000").

Figure 5:
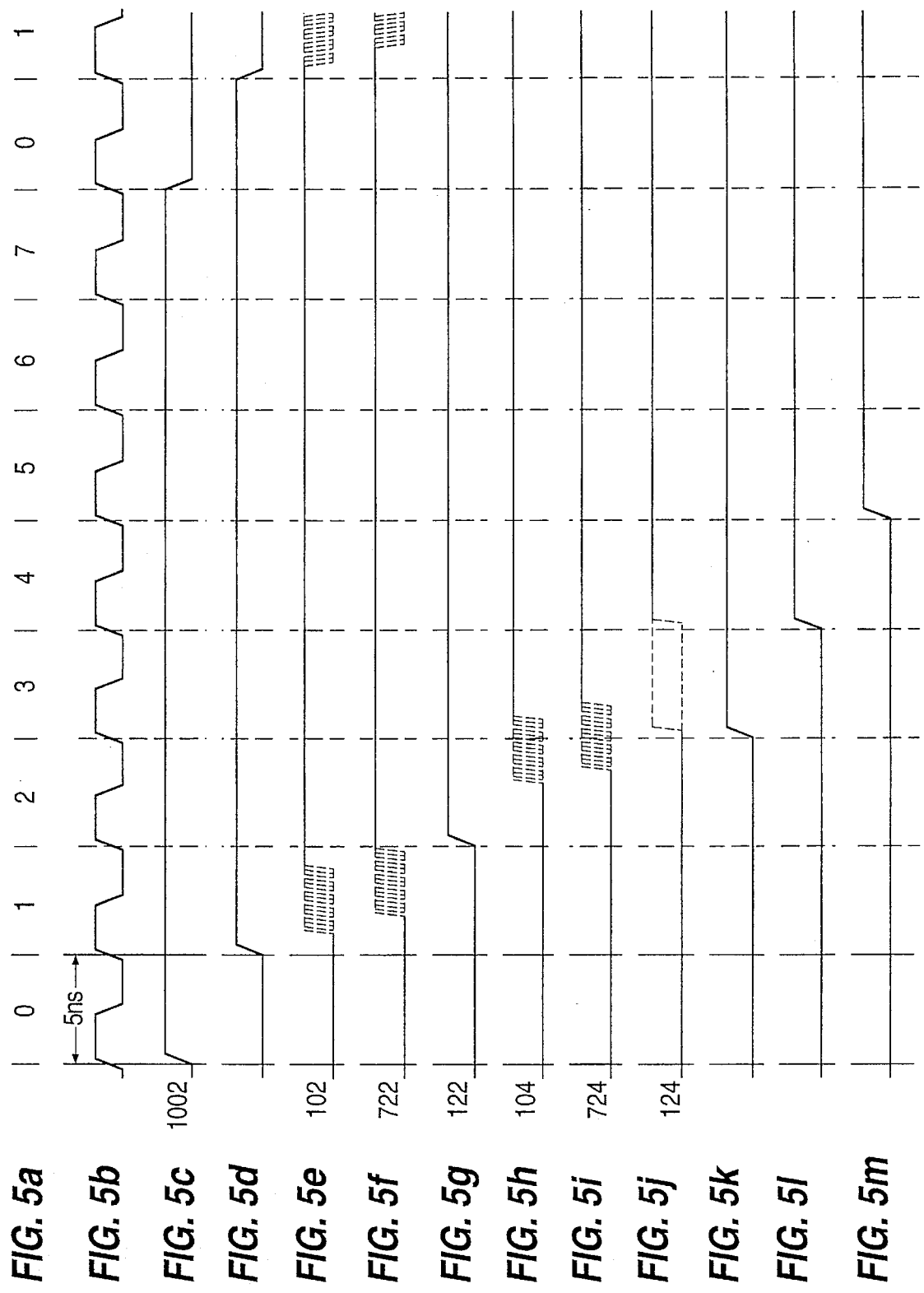
FIG. 5 made up of 5A–5U is a timing chart showing the operations of the control circuit of FIG. 4.

The operation of the circuit of FIG. 4 will be described with reference to FIG. 5 when the first initial data written in the memory LSIs 102 to 104 from the processor unit 730 and the first address for the writing operation are in the even mode. FIG. 5 is a timing chart before the delay times of the variable delay circuits 722 to 724 are adjusted, when they are set to have the shortest delay times.

If the frequency divider 1001 is a divider having sixteen frequencies, the clock signal to be applied through the wiring line 110 has its divided into sixteen so that the signal outputted from the flip-flop 1002 is changed at every eight clocks, as shown in FIG. 5. This signal is fed through the wiring line 1053 to the selector 721 of FIG. 1 and is synchronized with the clock signal by the flip-flop 120 until it is outputted as the address signal, as shown in FIG. 5. On the other hand, the signal to be outputted from the flip-flop 1002 is delayed by three to five clocks by the shift register 1011 to 1015 so that the early signal, the standard signal and the delayed signal are generated, as shown in FIG. 5.

Like the case of FIG. 2, the data returned from the memory LSI 102 change about 0.5 to 4.0 ns after the address signal changes. The signal returned from the memory LSI 104 changes about 7.5 to 11.0 ns. If, moreover, the variable delay circuits 722 to 724 have their delay times set to the minimum at first, for example, the output of the flip-flop 122 changes at the second cycle, and the output of the flip-flop 124 changes at the third or fourth cycle.

These waveforms are compared in the comparator 1030 with the standard signal, the early signal and the delayed signal. The comparator 1030 outputs the UP signal, when the output of the flip-flop 122, for example, is coincident with the early signal but not the standard signal (as seen at the third cycle of FIG. 5), to increment the counted value of the UP/DOWN counter by one.

When, on the contrary, the output of the flip-flop 122 is coincident with the delay signal but not the standard signal (as appears at the fourth cycle if it is delayed more than three cycles, although not seen from FIG. 5), the comparator 1030 outputs the DOWN signal to decrement the counted value of the UP/DOWN counter by one. In another operation, i.e., when the output of the flip-flop 122 is coincident with the standard signal (as seen at the 0-th and first cycles and at the fourth or later cycles of FIG. 5) or not with any signal (as seen at the second cycle of FIG. 5), the comparator 1030 outputs neither the UP signal nor the DOWN signal.

As a result, the signal for controlling the variable delay circuit 722 is increased step by step, when the output of the flip-flop 122 is earlier than the standard signal, but decreased step by step when the same is later. After lapse of a sufficient time period (i.e., the product of the period of the clock signal, the division ratio of the frequency divider 1001 and the maximum counted value of the counter 1040) from the start of the adjustment, the timing, at which the output of the flip-flop 122 changes, never fails to coincide with that for the standard signal. This also applies to the flip-flops 123 and 124.

Thus, the foregoing description is directed to the case in which the data written at first in the memory LSIs 102 to 104 from the processor unit 730 are in the even mode with the address signals. In the case of the odd mode, however, similar operations can be achieved by reversing the control signal of the selector 1003.

Another embodiment of the present invention is that before the processor operation, the aforementioned adjustments can also be accomplished for both the even mode and the odd mode. For this operation, the sequencer 731 may instruct the processor unit 730 the initial setting of the odd mode, after the end of the initial setting in the even mode by the initial data and the write address, so that the initial setting for the odd mode may be accordingly made by the processor unit 730. The sequencer 731 sets the control signal, to be fed to the selector 1003 of the standard signal generating circuit 1010 in the control circuit 720, then to "1" at the initial setting of the even mode and to "0" at the start of the initial setting of the odd mode.

Figure 6:
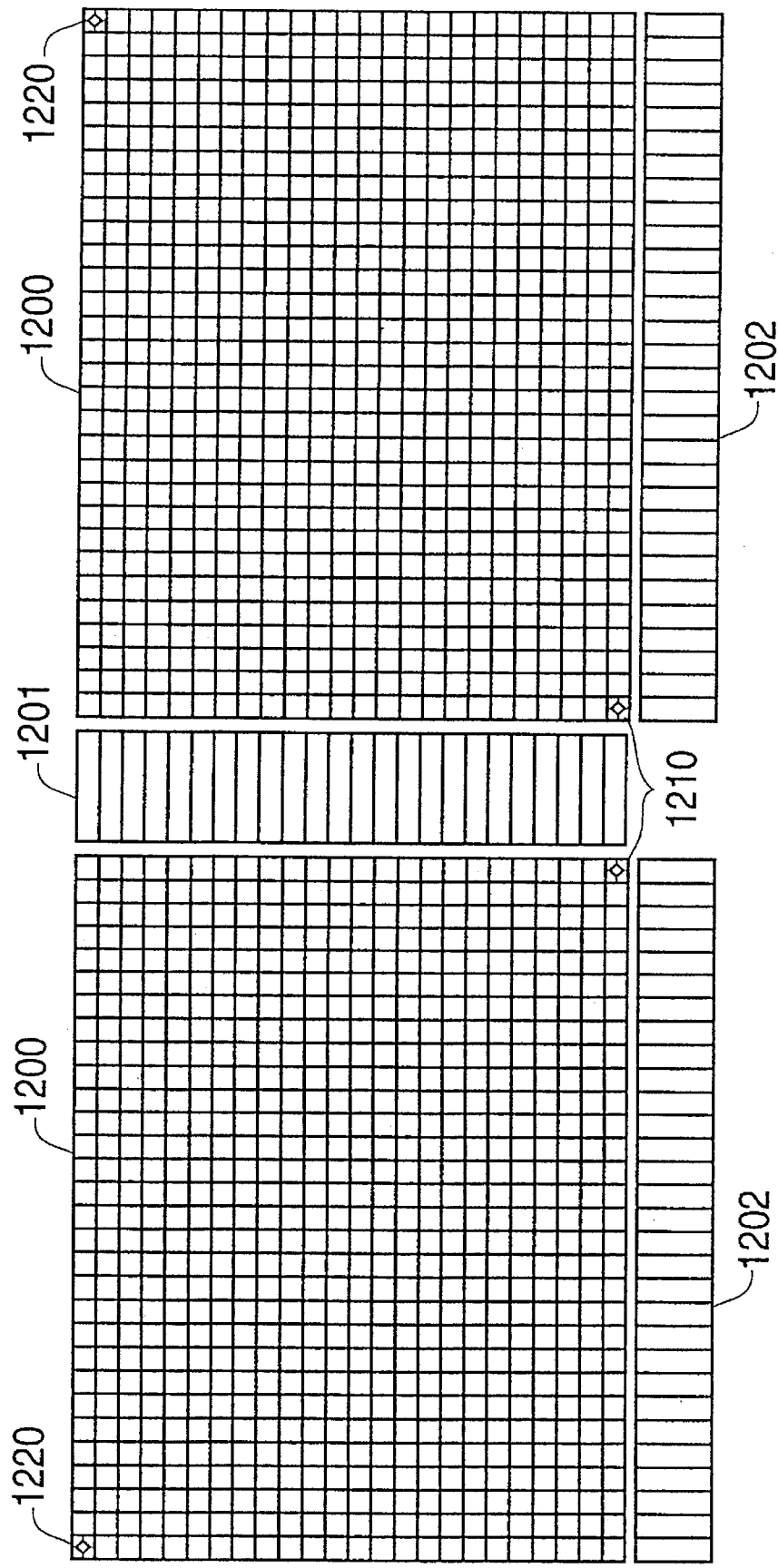
FIG. 6 is a diagram showing the construction of an ordinary memory LSI.

The adjustments described above can be sequentially executed for all the addresses in the memory LSIs 102 to 104 and for both the even mode and the odd mode. With these adjustments, the data signal never fails to be fetched at the desired timing no matter what address might be read out. Which address in the memory LSIs is early or late is frequently predicted. Specifically, the ordinary memory LSI is constructed, as shown in FIG. 6, such that numerous word lines and data lines laid perpendicularly of each other in a memory cell mat 1200, in which memory cells for storing the data are crosswise arrayed and individually connected with word drivers 1201 and sense amplifiers 1202. Of those memory cells, the memory cells, as located in the positions 1210 close to the word driver 1201 and the sense amplifier 1202, are early in access, and the memory cells, as located in the remote positions 1220, are late in access.

Thus, the aforementioned adjustments need not be accomplished for all the addresses but may be sufficient for the addresses corresponding to several memory cells in the vicinity of the positions 1210 close to the word drivers and the sense amplifiers and for the addresses corresponding to several memory cells in the vicinity of the remote positions 1220. In case, on the other hand, which of the reading of "0" or "1" is early is known in advance, the adjustments are sufficient only for the early ones of the memory cells in the vicinity of the close positions 1210 and for the late ones or the memory cells in the vicinity of the remote positions 1220.

Figure 8:
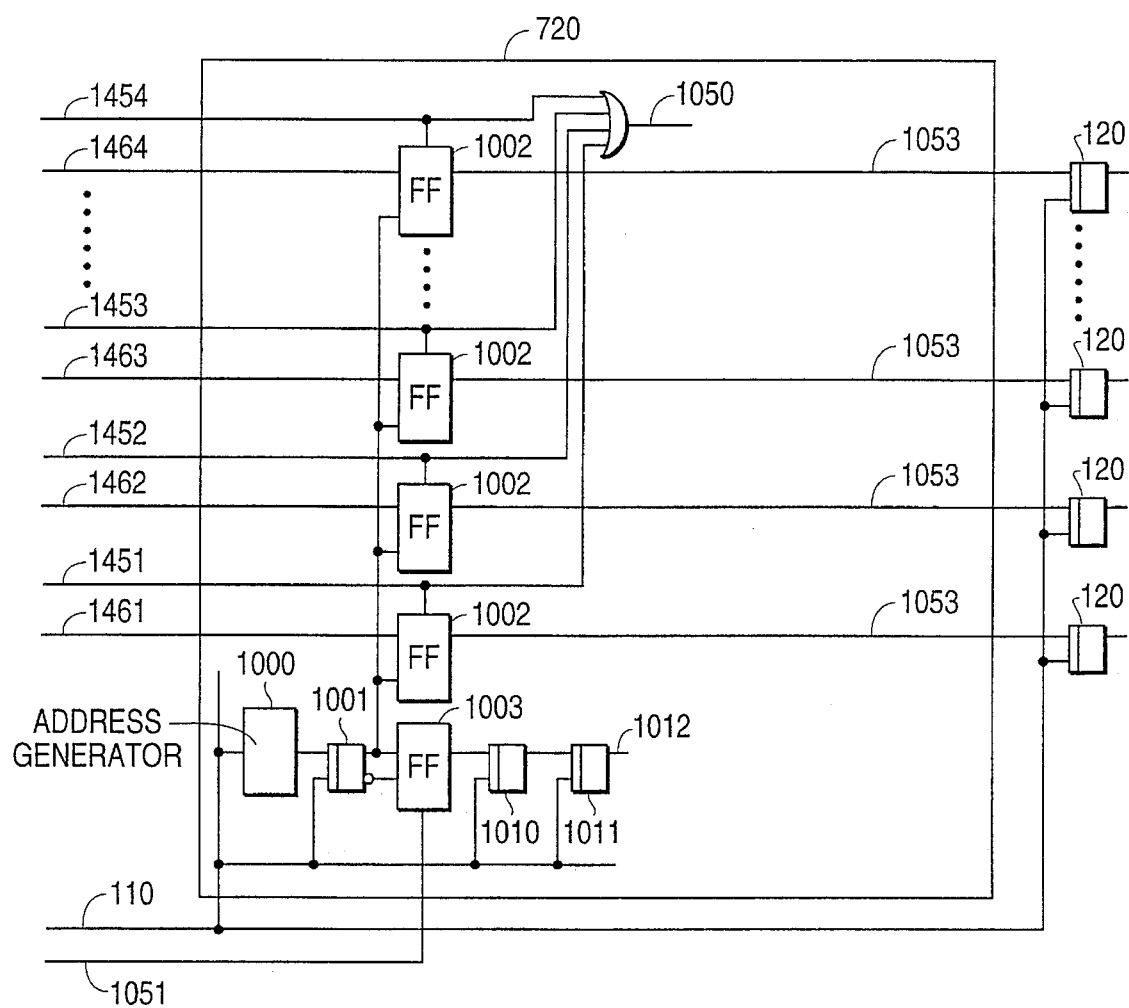
FIG. 8 is a circuit diagram showing another embodiment of the control circuit to be used in the embodiment of FIG. 1.

FIG. 8 is a circuit diagram showing a portion of another embodiment of the control circuit 720. This control circuit 720 is constructed such that several bits in the address signals can be adjusted while being switched.

The delay times until the data signals are returned are different depending upon not only which bit of the memory LSI is to be read out, as has been described with reference to FIG. 6, but also which bit of the address signals is to be switched. Therefore, the adjustments are desirably made such that several bits in the address signals are switched so that the data signals may be correctly fetched no matter which bit might be switched.

In FIG. 8, numerals 1451 to 1454 and 1461 to 1464 designate signal lines for transmitting the signals to be fed from the processor or the like or the sequencer or the like to be packaged in the logic LSI 101. The numerals 1451 to 1454 also designate control signals for discriminating which of the bits in the address signals the access time is to be adjusted for, and the numerals 1461 to 1464 also designate signal lines for transmitting a portion or all of the address signals for accessing the logic LSIs 102 to 104 in the running state after the initial adjustment. In the control circuit 720, there are present in addition to the portion shown in FIG. 8 the flip-flops 1013 to 1015, the UP/DOWN counter 1040 and the circuit 1030 for generating the signal for controlling the UP/DOWN counter, as in FIG. 4.

Figure 9:
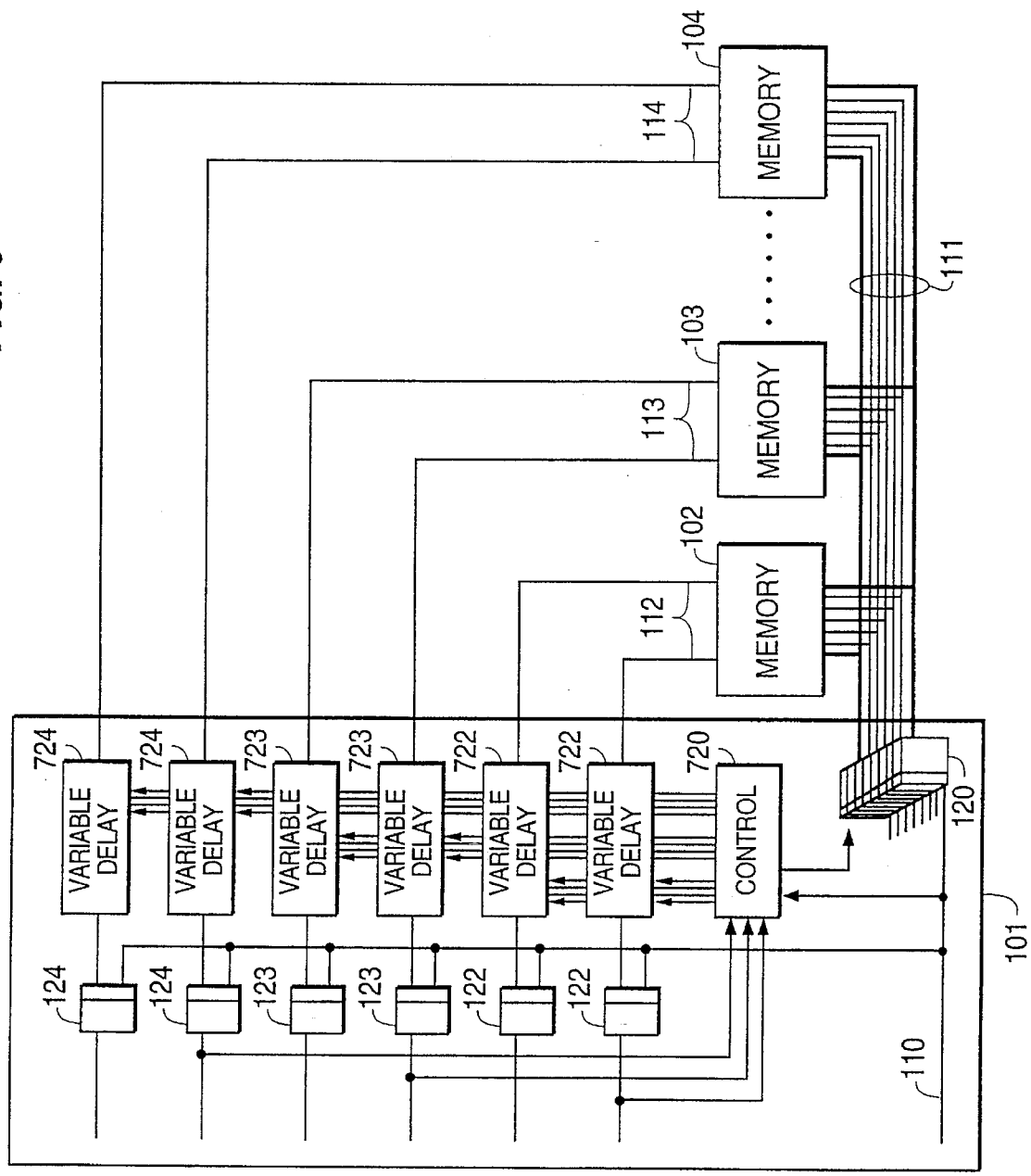
FIG. 9 is a circuit diagram showing another embodiment of the present invention.

The operation of the circuit of FIG. 8 is substantially the same as that of the circuit of FIG. 4. The variable delay circuits are controlled such that if one or more of the signal lines are set to the high level, the waveform made by dividing the frequency of the clock signal appears in the corresponding bits in the address signals so that the data signals may be fetched at a predetermined timing. At the running time, moreover, all the signal lines are set to the low level to set a signal line 1050 corresponding to the signal 752 of FIG. 4 to the low level so that the variable delay circuits have their delay times fixed FIG. 9 is a circuit diagram showing another embodiment of the entire construction. The construction of FIG. 9 is substantially the same as that of FIG. 1 but is different in that the bit number of the data signals returned from the individual memory LSIs 102 to 104 to the logic LSI 101 is in plurality. In the case of the embodiment of FIG. 9, the variable delay circuits 722 to 724 are provided for each bit. However, the control signal can be provided for each bit, but the variable delay circuits for receiving the data signals from the same memory LSI can be controlled by the same control signal.

Specifically, the data signal outputted from the same memory LSI has the same propagation time for the corresponding address signal, and the dispersion of the delay times of the semiconductor elements in the same LSI is thought to be smaller than that between the LSIs. If, therefore, the propagation times of the passages 112 to 114 of the data signals for the individual memory LSIs are equalized, the time periods from the instant when the address signals are sent out of the flip-flop 120 to the instant when the data signals reach the variable delay circuits 722 to 724 are substantially equal for the individual memory LSIs. If, therefore, the data signal is selected bit by for each memory LSI to adjust the timing at which it is fetched by the flip-flops 122 to 124, all the data signals are fetched at a predetermined timing by the flip-flops 122 to 124 by feeding the same control signal to other variable delay circuits 722 to 724.

Figure 10:
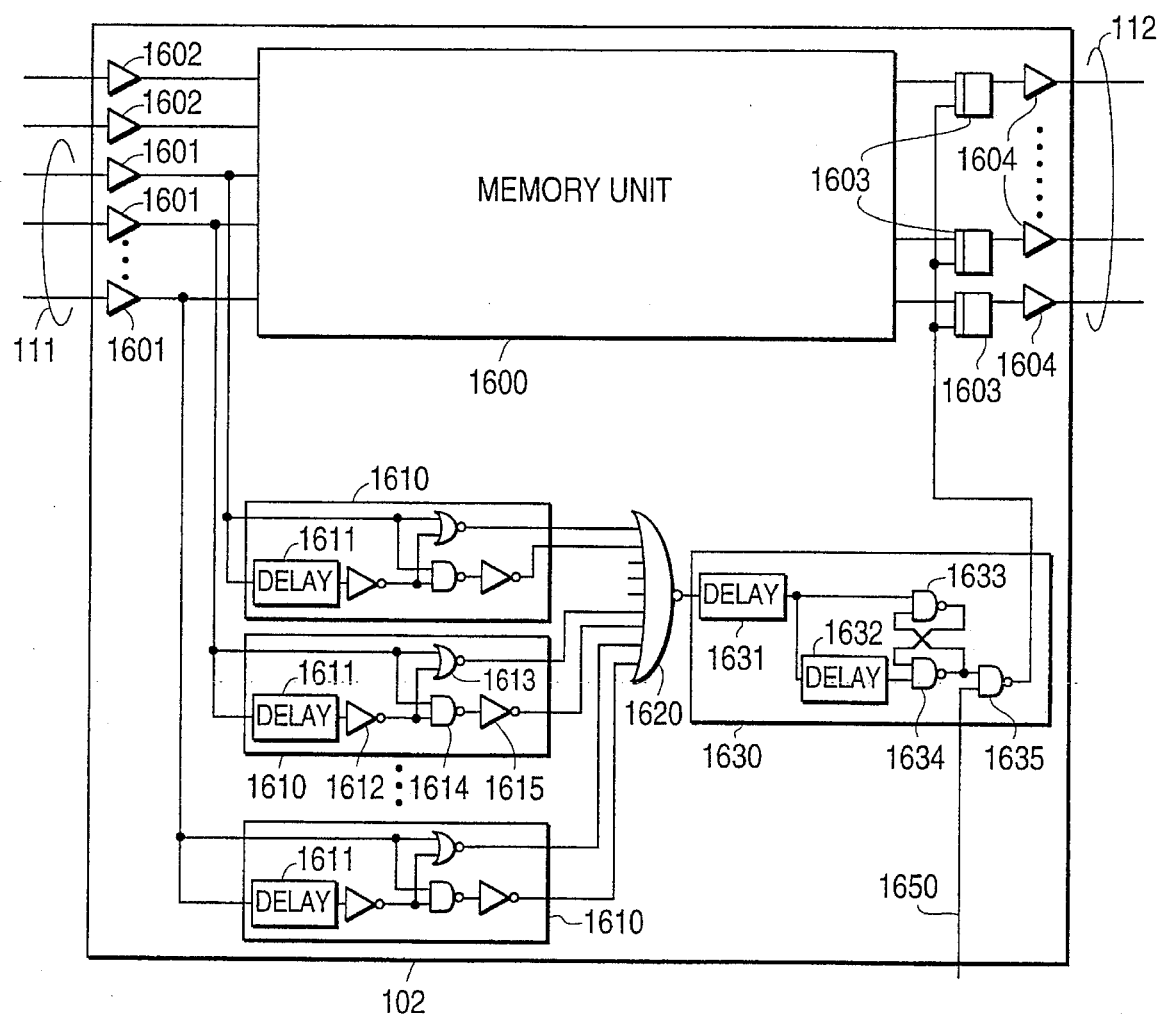
FIG. 10 is a circuit diagram showing one embodiment of the memory LSI of the present invention.

Apparent from FIG. 2, if the width of the time for which the outputs of the memory LSIs possibly change is shortened, the data reading time interval can be shortened even for the same time period before the fixture. FIG. 10 is a circuit diagram showing one embodiment of the method of constructing the memory LSIs with a view to shortening that time width.

In FIG. 10: numeral 1601 designates input buffers for address signals; numeral 1602 input buffers for other control signals such as write enable or chip select signals; numeral 1604 output buffers for data signals; numeral 1603 flip-flops for controlling the timings at which the data signals are outputted; and numeral 1603 a memory unit for ordinary memory operations. Moreover, numeral 1610 designates circuits for detecting that the address signals have changed, and numeral 1630 designates a circuit for feeding a signal for the flip-flops 1603 to fetch the data a predetermined time after the address signals have changed.

Figure 11:
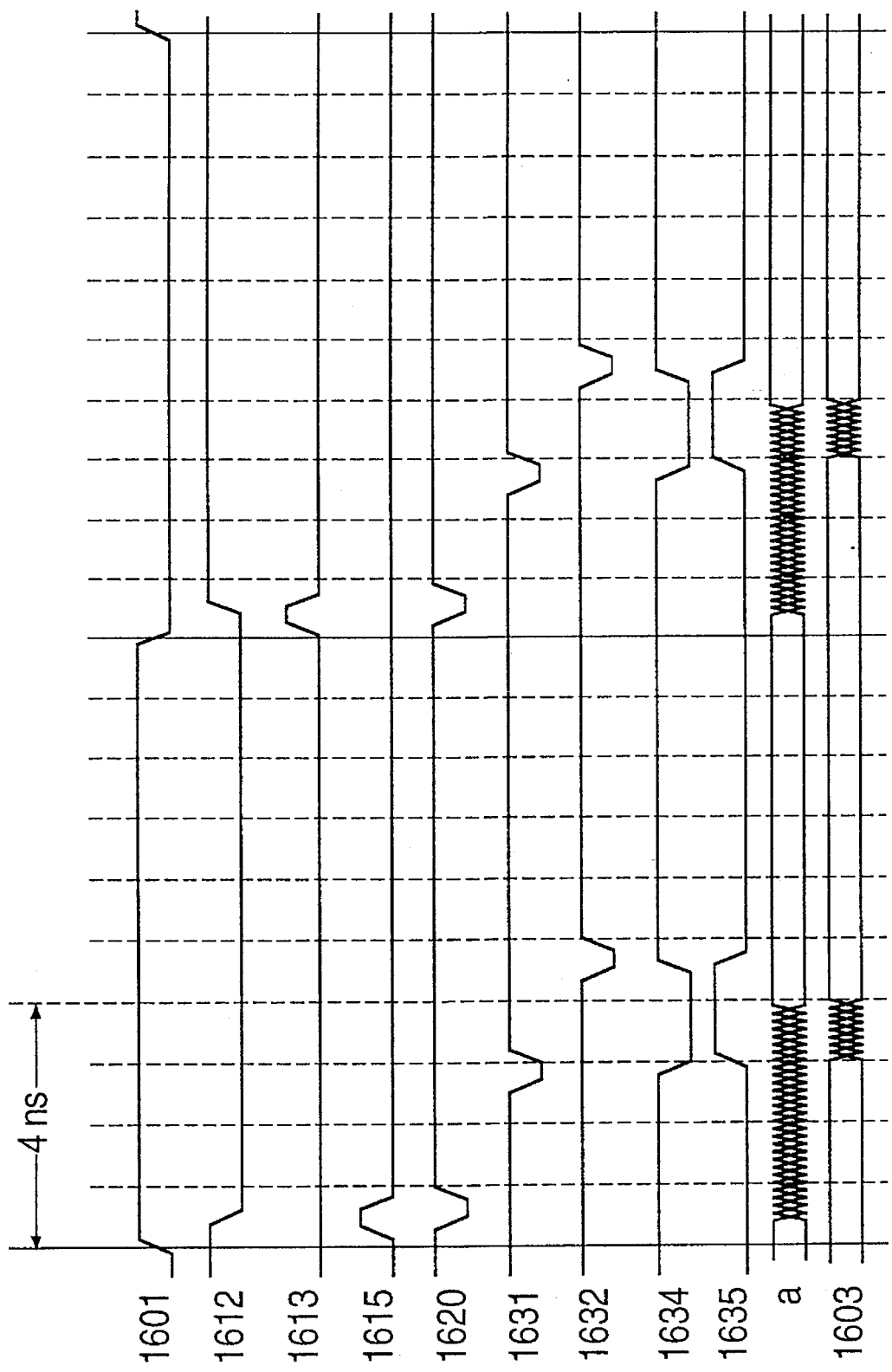
FIG. 11 is a timing chart showing the operation of the memory LSI of FIG. 10.

One example of the operation of the circuit of FIG. 10 is shown in FIG. 11. In this case, there is adopted the type (i.e., hereinafter "level sense type"), in which the flip-flops 1603 output the signals inputted to the data input terminals, as they are, while they are being fed with the signal of the high level from the circuit 1630.

In the circuit of FIG. 10, when the address signals outputted from the input buffer 1601 rise, the outputs of inverter circuits 1612 fall with a short delay, as shown in FIG. 11, so that short pulses are outputted from inverter circuits 1615. On the contrary, when the address signals outputted from the input buffers 1601 fall, the outputs of the inverter circuits 1612 rise with a short delay so that short pulses are outputted from NOR circuits 1613. Here, if a short pulse waveform is outputted to the output of any of the plurality of circuits 1610, a NOR circuit 1620 outputs a short pulse of the odd mode to the circuit 1630.

The circuit 1630 is constructed such that the pulse sent from the NOR circuit 1620 is delayed by a predetermined time period by a delay circuit 1631 to raise the output of a NAND circuit 1635 to the high level and is further delayed by a predetermined time period by a delay circuit 1632 to return the output of the NAND circuit 1635 to the low level. As a result, even if the data outputted from the memory unit 1600 begin changing early, no output is issued from the flip-flop 1603 till a predetermined time period set by the delay circuit 1631 elapses.

If, moreover, the delay time period of the delay circuit 1631 is so set that the output of the NAND circuit 1635 takes the high level by the time the data signal outputted from the memory unit 1600 is fixed, the increase in the access time resulting from the use of the construction of FIG. 10 can be as short as the delay time of one stage of the flip-flop 1603.

Moreover, the delay time period of the delay element 1632 may be so set that the output of the NAND circuit 1635 takes the low level after the data signal outputted from the memory unit 1600 is fixed and fetched by the flip-flop 1603. If the delay time periods of those two delay elements 1631 and 1632 are so set that the output of the NAND circuit 1635 rises immediately before and falls immediately after the signal outputted from the memory unit 1600 is fixed, the time period, for which the memory LSI may possibly change, is so shortened that the data can be read out at the short time interval.

Incidentally, a signal line 1650 of FIG. 10 is provided for applying a control signal for bringing the flip-flop 1603 into a through state to operate the memory LSI like an ordinary one. This signal is useful in case the memory LSI is to be tested by using a memory tester for the ordinary memory LSI.

Figure 12:
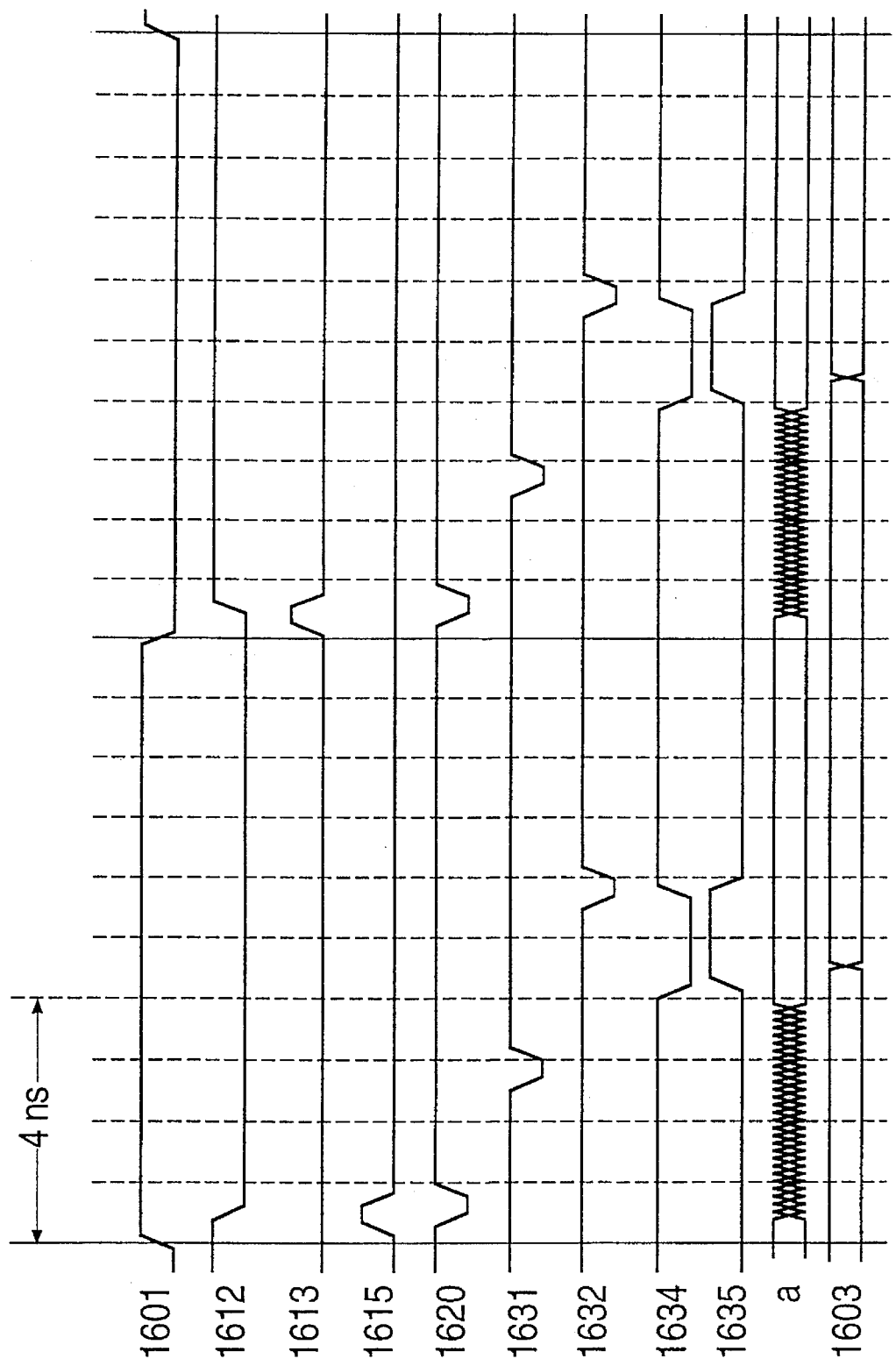
FIG. 12 is a timing chart showing the operation of the memory LSI of FIG. 10 under another condition.

FIG. 12 is a diagram showing one example of another embodiment of the present invention providing another operation of the circuit of FIG. 10. In the case of FIG. 12, the flip-flop 1603 is exemplified by the edge trigger type flip-flop. In the case of FIG. 12, moreover, the delay time period of the delay element 1631 is set to a value slightly longer than that of the case of FIG. 11. Specifically, since the flip-flop 1603 is of the edge trigger type, the output of the NAND circuit 1635 has to be so set that it may rise after the signal outputted from the memory unit 1600 has been fixed. This makes the access time slightly longer than that of the case of FIG. 11 but can make the width of the time period, for which the data output may possibly change, far shorter.

Figure 13:
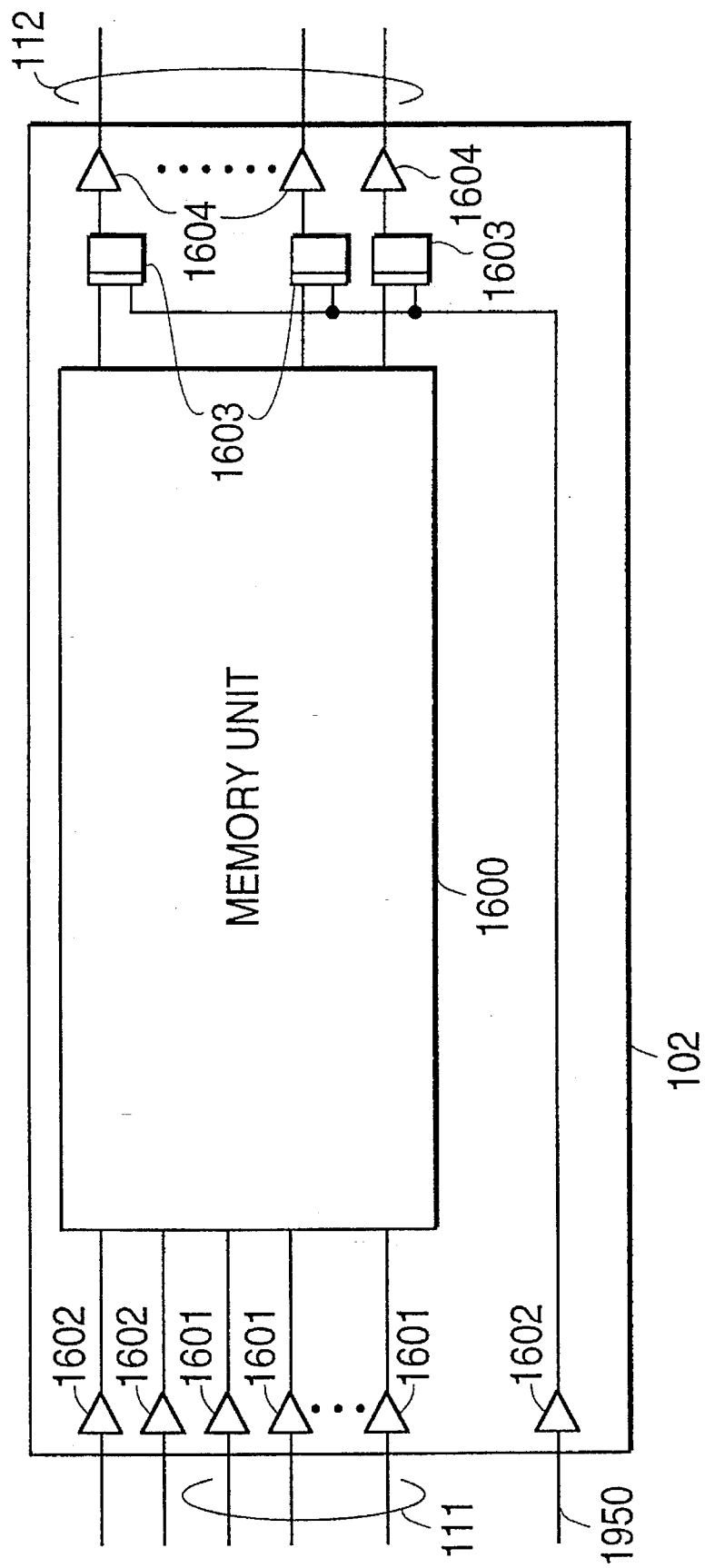
FIG. 13 is a circuit diagram showing the construction of an ordinary memory LSI with an output latch.

FIG. 13 is a circuit diagram showing another embodiment of the present invention providing for the construction of a memory LSI having the same object as that of FIG. 10. This memory LSI is generally called the "output latch memory". This circuit is constructed such that the timing for the flip-flop 1603 to fetch a signal is determined by the clock signal fed from the outside through a signal line 1950. This memory LSI is advantageous in that the timing for the output signal to change is determined exclusively by the clock signal, but has a disadvantage that a high-speed clock signal having a frequency twice as high as that of the address signal has to be fed to the memory LSI.

Figure 14:
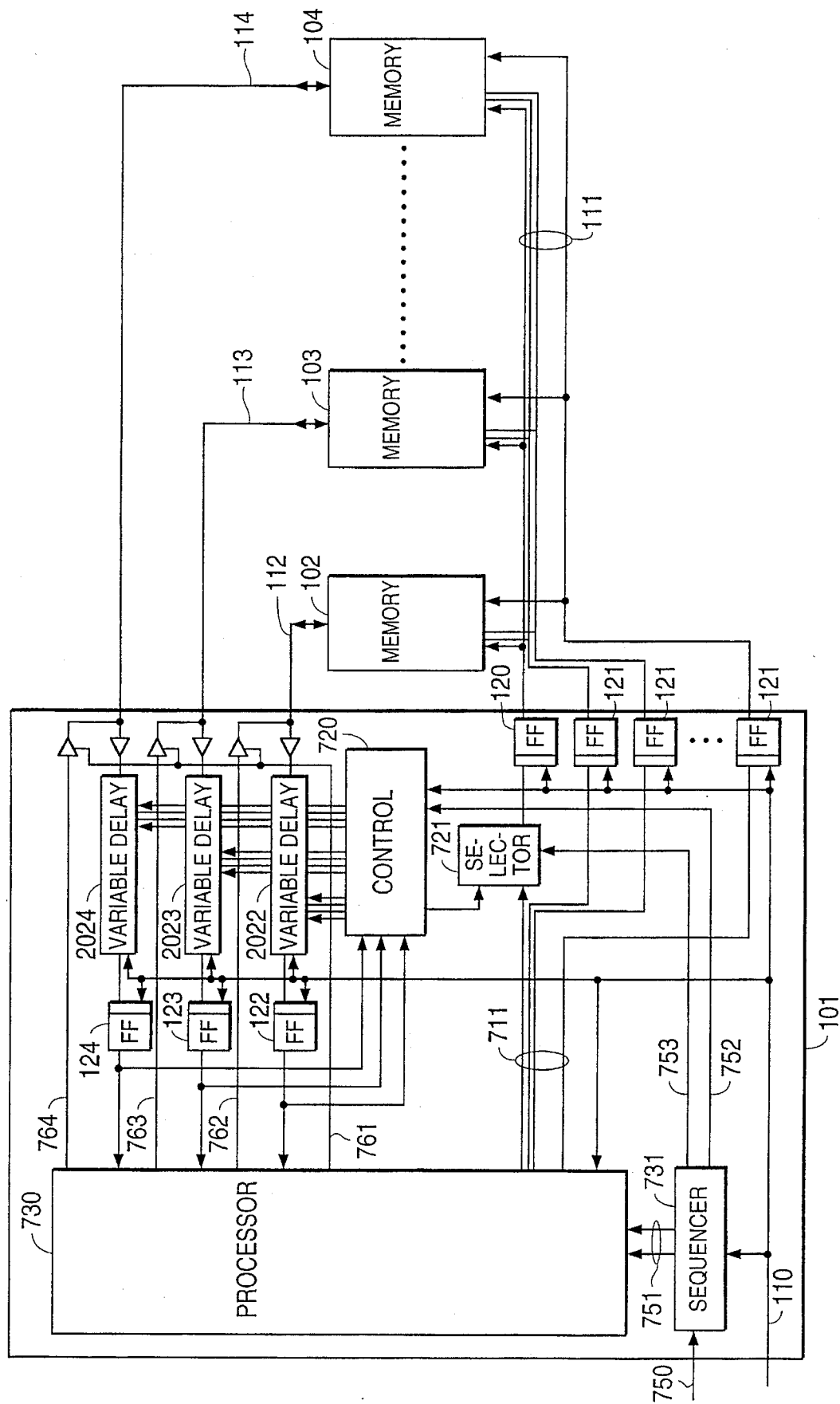
FIG. 14 is a circuit diagram showing another embodiment of the present invention.

FIG. 14 is a circuit diagram showing another embodiment of the present invention. The construction of FIG. 14 can be achieved in addition to that of. FIG. 1 if the memory LSI having a small time width having a possibility of changing the data Is used, as shown in FIG. 10 or 13. In the construction of FIG. 14, synchronizing circuits 2022 to 2024 are used in place of the variable delay circuits 722 to 724 of FIG. 1 so that the construction of the control circuit 720 is accordingly modified.

Figure 15:
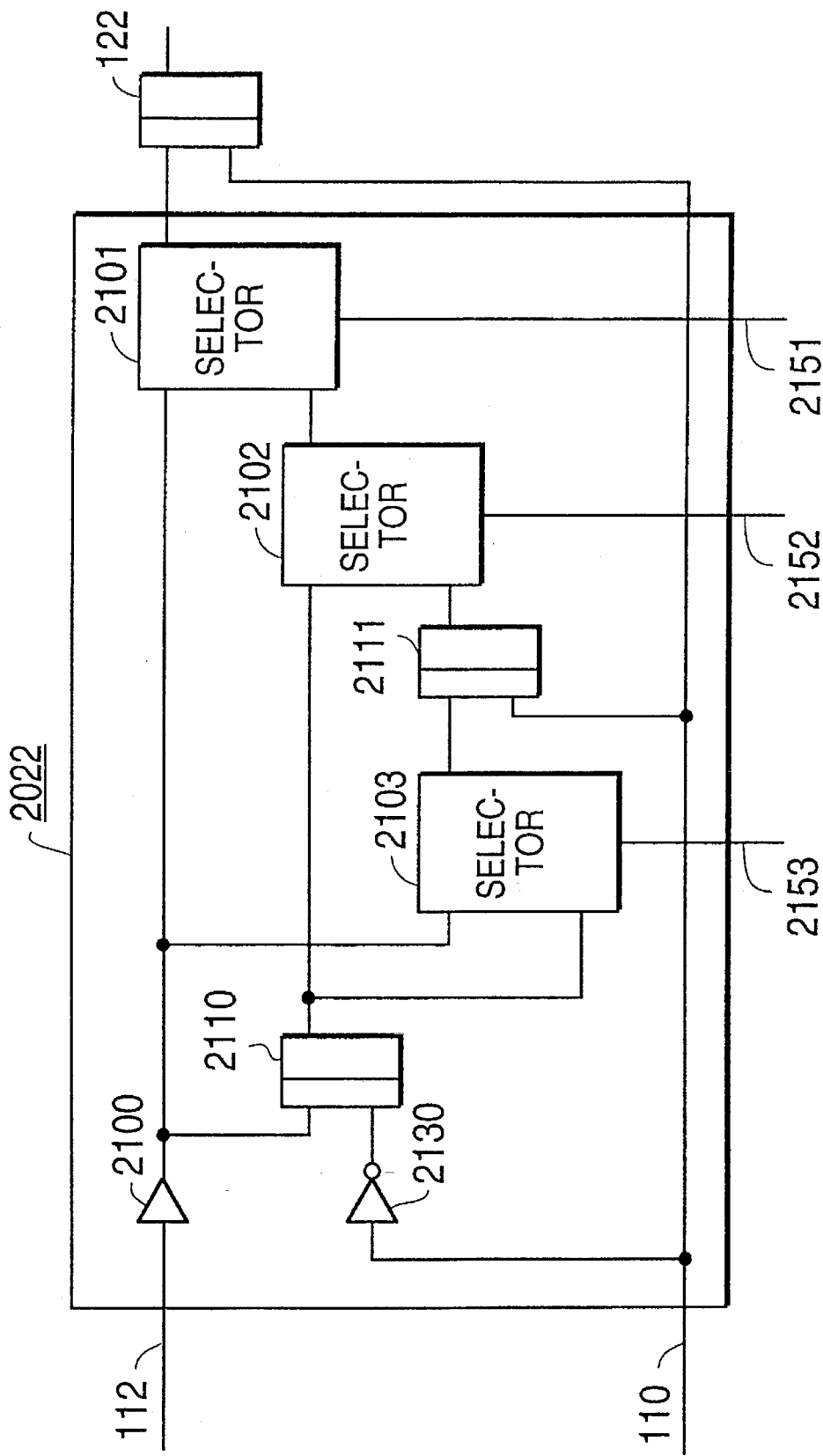

One embodiment of the construction of the synchronizing circuit 2022 is shown in FIG. 15. In FIG. 15 numeral 2100 designates an input buffer; numerals 2101 to 2103 selectors; numerals 2110 and 2111 flip-flops; and numeral 2130 an inverter circuit for generating a clock signal of the odd mode. Moreover, all the flip-flops appearing in FIG. 15 are of the edge trigger type.

If, in this case, the data signal returned from the memory LSI is later, the selector 2101 selects the upper input of the drawing and inputs the signal received at the input buffer 2100 directly to the flip-flop 122. If the data signal returned from the memory LSI is accelerated by the time period corresponding to about one half of the period of the clock signal, it may possibly be fetched by the flip-flop 122 earlier by the clock of the preceding one cycle. Then, the selector 2101 selects the lower signal of the drawing whereas the selector 2102 selects the upper signal of the drawing so that the signal delayed by about one half period by the flip-flop 2110 is applied to the flip-flop 122. As a result, the fetching can be more ensured at the desired timing.

Figure 16:
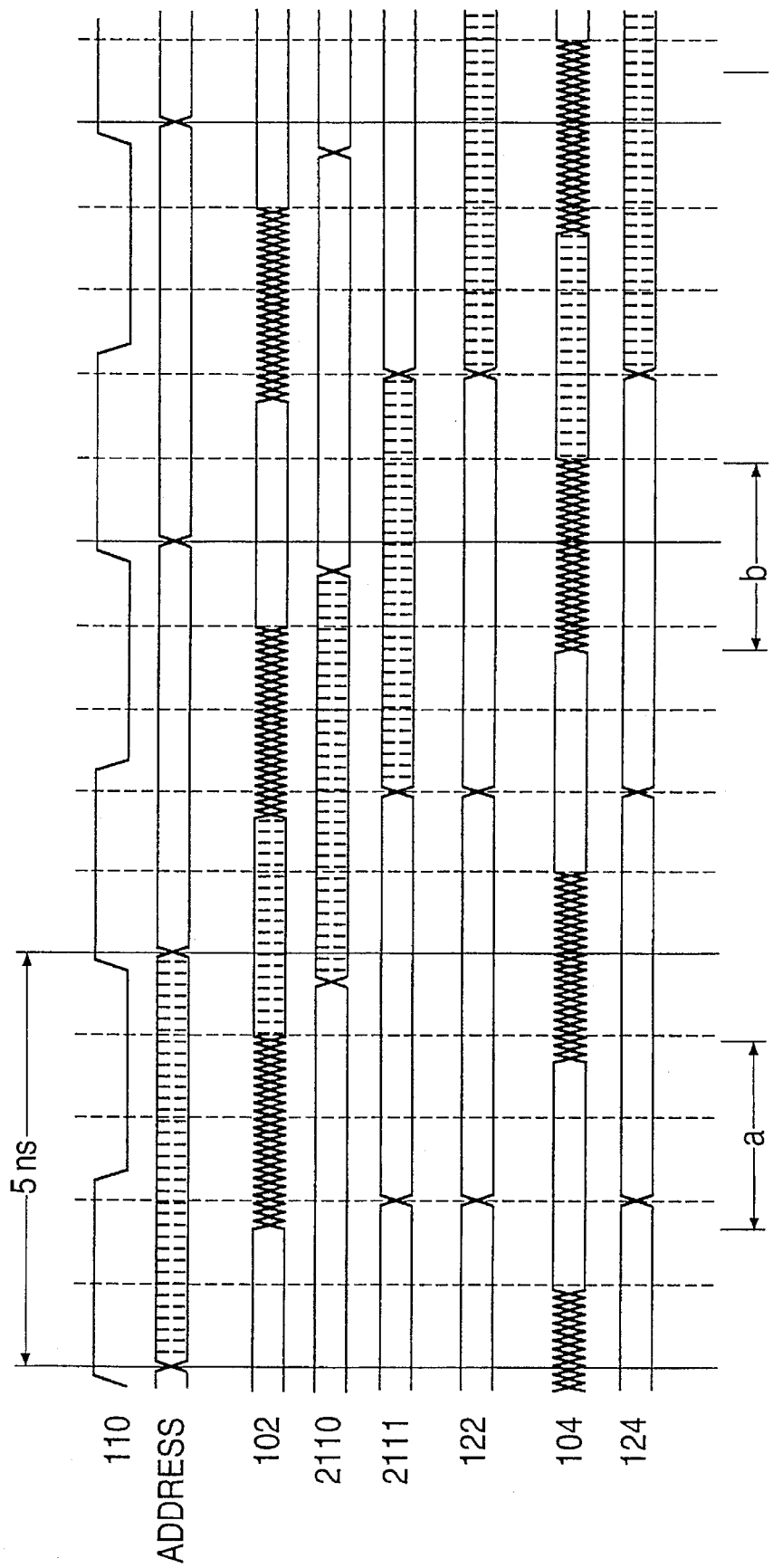
FIG. 16 is a timing chart showing the operation of the embodiment of FIG. 14.

If the state is made earlier by about one half period or about one period, the flip-flop 122 is fed with the signal which is delayed by one period by the flip-flop 2111. If the state is made earlier by one half period, the flip-flop is fed with the signal which is delayed by one and half period by the flip-flops 2110 and 2111. In either case, the signal can be fetched at the desired timing. The operating waveforms of the case in which the circuits of FIGS. 14 and 15 are used, are shown in FIG. 16. However, the delay times of the portions other than the logic LSI 101 are made similar to those of the case of FIG. 2.

As shown in FIG. 16, the instant when the data signal returned from the most remote memory LSI 104 is delayed from that of the case of FIG. 2, but the instant when the same is fixed is substantially identical to that of the case of FIG. 2. As a result, the data signal can be fetched, as in FIG. 2, by the flip-flop 124 in synchronism with the clock signal three cycles after the address signal has been sent out. On the other hand, the data signal returned from the closest memory LSI 102 is not fixed before it begins changing before a time period corresponding to about one and half period of the clock signal. As a result, the clock signal is fetched by the flip-flop 2110 in synchronism with its fall, and the output is fetched by the flip-flop 2111 in synchronism with its rise and is fed to the flip-flop 122 so that it can be fetched at the same timing as that of the flip-flop 124.

Figure 17:
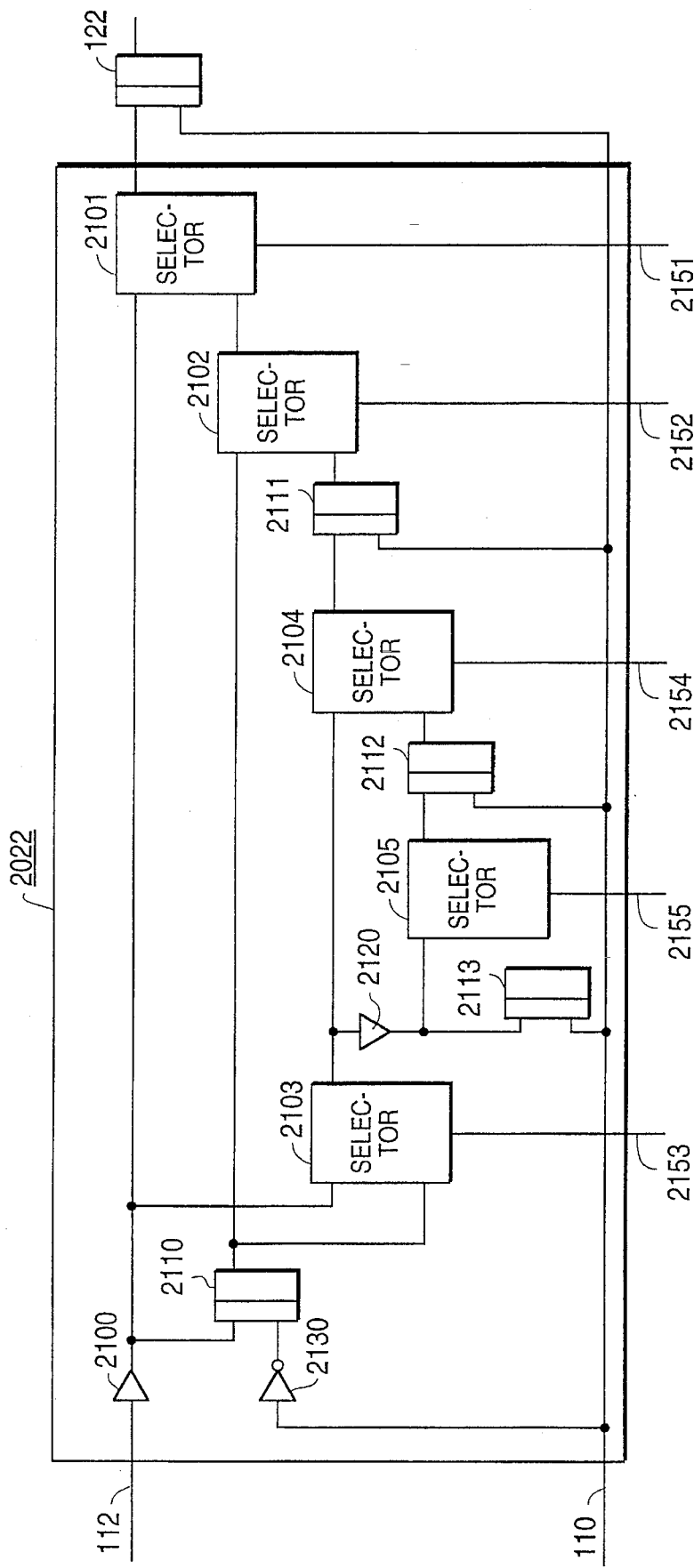
FIG. 17 is a circuit diagram showing another embodiment of the synchronizing circuit to be used in the embodiment of FIG. 14.

FIG. 17 is a circuit diagram showing another embodiment of the present invention providing for the construction of a synchronizing circuit having its adjustable range widened more. This circuit is made by adding a circuit, which is composed of selectors 2104 and 2105, flip-flops 2112 and 2113 and a buffer circuit 2120 between the selector 2103 and the flip-flop 2111 of the synchronizing circuit of FIG. 15. The adjusting range is widened by a time period corresponding to the two periods of the clock signal by switching the control signals of the selectors 2104 and 2105. The adjusting range can be further widened, if intended so, without increasing the number of gate stages between the flip-flops by adding a similar circuit between the flip-flop 2113 and the selector 2105.

The synchronizing circuit of FIG. 17 or the like can also be controlled by the control circuit 720 shown in FIG. 4 or 8, but the manner of changing control signals 2151 to 2155 outputted from the UP/DOWN counter 1040 has to be slightly changed, as enumerated in Table 2.

TABLE 2

| Signal Line | Counted Number | | | | | | | |
|---|---|---|---|---|---|---|---|---|
| | 0 | 1 | 2 | 3 | 4 | 5 | 6 | 7 |
| 1350 | L | H | L | H | L | H | L | H |
| 1351 | L | L | H | H | L | L | H | H |
| 1352 | L | L | L | L | H | H | H | H |
| 2151 | L | H | H | H | H | H | H | H |
| 2152 | (L) | L | H | H | H | H | H | H |
| 2153 | (L) | (H) | L | H | L | H | L | H |
| 2154 | (L) | (L) | L | L | H | H | H | H |
| 2155 | (L) | (L) | (L) | (L) | L | L | H | H |

Figure 18:
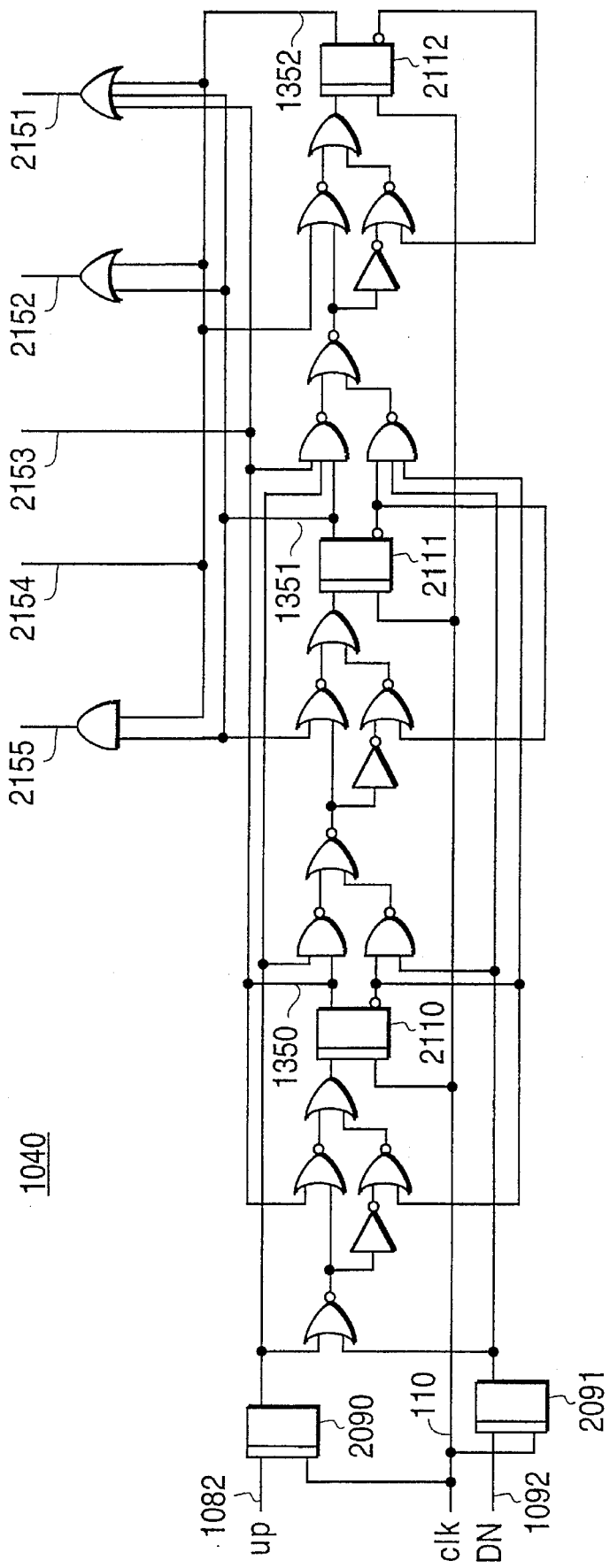
FIG. 18 is a circuit diagram showing another embodiment of the UP/DOWN counter to be used in the control circuit of FIG. 4.

One example of the construction of the UP/DOWN counter for outputting these control signals is shown in FIG. 18. The circuit of FIG. 18 counts up or down the clock signal, which is fed from the signal line 110, in response to the control signals fed from the signal lines 1082 and 1092. This operation is identical to that of the UP/DOWN counter of FIG. 7 till its result is indicated by a binary mode by the signals appearing on the signal lines 1350 to 1352. However, the control signals appearing on the signal lines 2151 to 2155 are enumerated in Table 2.

Figure 19:
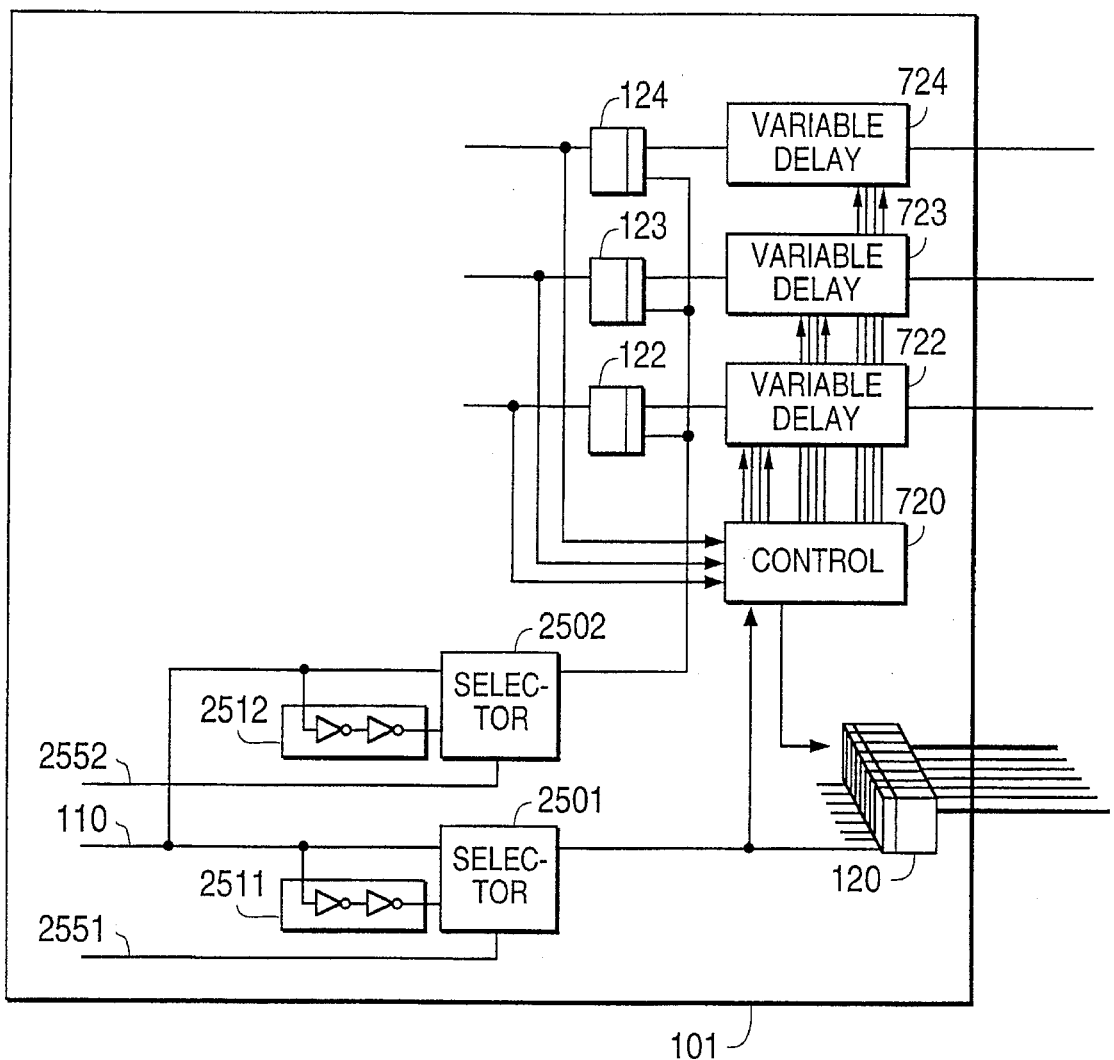
FIG. 19 is a circuit diagram showing another embodiment of the present invention.
Figure 20:
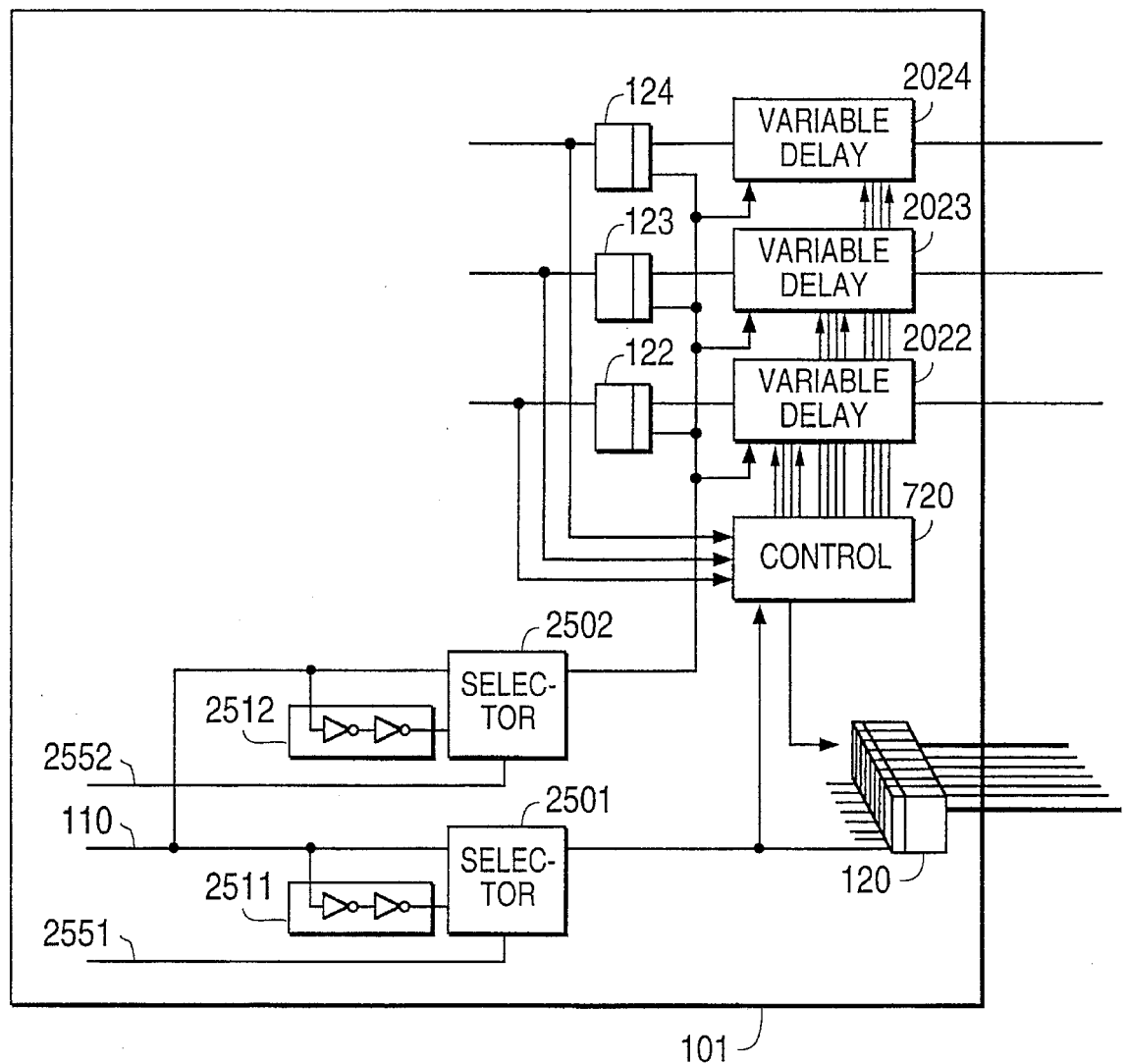
FIG. 20 is a circuit diagram showing another embodiment of the present invention.

FIGS. 19 and 20 are circuit diagrams showing the individual portions of the constructions of another embodiment of the present invention. The constructions illustrated in FIGS. 19 and 20 are made by adding selectors 2501 and 2502 and delay circuits 2511 and 2512, respectively, to the embodiment of FIG. 9 and the embodiment of FIG. 14. These embodiments are made such that the phases of the clock signals to be applied to the flip-flop group 120, the flip-flops 122 to 124 or the synchronizing circuits 2022 to 2024 can be slightly delayed by switching the control signals to be fed to signal lines 2551 and 2552.

At the time of initially setting the delay times of the variable delay circuits 722 to 724 and the states of the selectors of the synchronizing circuits 2022 to 2024, this circuit executes the initial setting operations for both the state, in which only the clock signals to be applied to the flip-flop group 120 are delayed, and the state, in which only the clock signals to be fed to the flip-flops 122 to 124 and the synchronizing circuits 2022 to 2024 are delayed. In the running state, moreover, the signal lines 2551 and 2552 are fed with such control signals that the selectors 2501 and 2502 select paths not through the delay circuits 2511 and 2512.

As a result, at the initial setting time, the adjustments are carried out for both the state, in which the waveform of the clock 110 of FIGS. 2 and 16 is slightly shifted rightward, and the state, in which the data from the memory LSIs 102 and 104 are slightly shifted rightward, so that they are fetched at a normal timing even with more or less shifts. After this, the circuit is used without any shift at the running time so that it can be used in a more stable state at the running time.

In the description of the individual embodiments of FIGS. 1, 9, 14, 19 and 20, it is assumed that the memory LSIs 102 to 104 are provided in plurality, and it is intended that the data signals returned from all the memory LSIs are simultaneously fetched by correcting the dispersion of the time periods for which the data signals are returned from the individual memory LSIs. However, the aforementioned individual embodiments are all effective even in the case of only one memory LSI.

Specifically, if the clock signals have their periods shortened, the time period till the data signals are returned back may be so shifted at the designing time from a predetermined value because of the manufacturing dispersion of the delay times of the LSIs, even if only one memory LSI is connected with the logic LSI 101, so that the data signals may not be fetched in response to the clock signal of a predetermined cycle. If the present invention is applied to that case, the manufacturing dispersion or the like of the delay time is corrected by the variable delay circuit 722 or the synchronizing circuit 2022 so that the data signals can be fetched at the predetermined timing.

As has been described hereinbefore, according to the present invention, the time interval for reading out the data from the memory LSIs can be shortened.

While the present invention has been described in detail and pictorially in the accompanying drawings it is not limited to such details since many changes and modifications recognizable to those of ordinary skill in the art may be made to the invention without departing from the spirit and the scope thereof.

What is claimed is:

1. A memory data output circuit for outputting data read out from a plurality of memories at substantially the same time in a data processing system which includes a processor, a plurality of memories, an address bus for transmitting an address fed from said processor to said plurality of memories, and a plurality of data buses provided individually for said plurality of memories for transmitting a plurality of data fed from said processor in parallel to said plurality of memories and for transmitting a plurality of data read out of said plurality of memories in parallel to said processor, said memory data output circuit comprising:

a plurality of transmission circuits provided individually for said plurality of memories for transmitting from said plurality of memories via said plurality of data buses to said processor a plurality of data read out of said plurality of memories with adjustable delay times; and a control circuit which adjusts delay times of said plurality of transmission circuits in response to data output timings of said plurality of transmission circuits at which the plurality of data read out of said plurality of memories are provided by said plurality of transmission circuits.

2. A memory output circuit as set forth in claim 1, wherein said control circuit includes:

a first circuit which feeds a read address to said plurality of memories via said address bus;

a monitor circuit which monitors individual data output timings of said plurality of transmission circuits; and a second circuit which adjusts the individual delay times of said plurality of transmission circuits in accordance with results of monitoring by said monitor circuit.

3. A memory output circuit as set forth in claim 2, wherein said monitor circuit comprises:

a generator circuit which generates a standard signal indicating a standard timing, at which said plurality of data should reach said processor through said plurality of transmission circuits; and a third circuit which monitors the data output timings of said plurality of transmission circuits in terms of differences between the data output timings of said plurality of transmission circuits and the standard timing indicated by said standard signal.

4. A memory data output circuit as set forth in claim 3, wherein said third circuit selectively outputs one of a count up signal and a count down signal to each of said plurality of transmission circuits based upon one of the differences monitored by said monitor circuit for each of said plurality of transmission circuits, wherein said second circuit includes an UP/DOWN counter responding to said one of said count up signal and said count down signal provided by said monitor circuit for each of said plurality of transmission circuits, wherein each of said transmission circuits comprises a variable delay circuit for delaying the data read out to the corresponding data bus with a delay time corresponding to a count value of the UP/DOWN counter;

wherein said first circuit feeds a read address at different times so that said third circuit repeats outputting of one of a count up signal and a count down signal for said plurality of transmission circuits.

5. A memory data output circuit as set forth in claim 4, wherein said control circuit further comprises:

an output circuit which outputs an early signal and a delayed signal, which are shifted by a constant time period from said standard signal, and wherein said third circuit includes a plurality of circuits each circuit provided for one of said transmission circuits, said each circuit generating a count-up signal or a count-down signal from said standard signal, said early signal, said delayed signal and one of the data outputs by one of said transmission circuits.

6. A memory data output circuit as set forth in claim 2, further comprising:

a plurality of flip-flops for receiving the outputs of said plurality of transmission circuits in response to identical operating clocks of said processor and feeding the received signals to said processor, wherein said monitor circuit includes a detection circuit which detects the timings of changes of outputs of said flip-flops.

7. A memory data output method of outputting data read out from a plurality of memories at substantially the same time in a data processing system which includes a processor, a plurality of memories, an address bus for transmitting an address fed from said processor to said plurality of memories, and a plurality of data buses provided individually for said plurality of memories for transmitting a plurality of data fed from said processor in parallel to said plurality of memories and transmitting a plurality of data read out of said plurality of memories in parallel to said processor, said memory data output method comprising the steps of:

delaying transmission of a plurality of data, read out of said plurality of memories, to said processor via said plurality of data buses; and determining individual delay times of said transmission so that the plurality of data read out of said plurality of memories for an identical address fed from said processor may reach said processor at substantially the same time;

wherein said determining step includes the step of:
   controlling the delay times of a plurality of transmission circuits for transmitting to said plurality of data buses data from said plurality of memories in response to data output timings of said plurality of transmission circuits at which the plurality of data read out of said plurality of memories are provided by said plurality of transmission circuits.

8. A memory output method as set forth in claim 7, wherein said control step includes the steps of:

feeding a read address to said plurality of memories so as to determine the delay times of said plurality of transmission circuits;

monitoring the individual data output timings of said plurality of transmission circuits; and adjusting the individual delay times of said plurality of transmission circuits in accordance with results of said monitoring step.

9. A memory output method as set forth in claim 8, wherein said monitoring step comprises the steps of:

generating a standard signal indicating a standard timing, at which said plurality of data should reach said processor through said plurality of transmission circuits; and monitoring the data output timings of said plurality of transmission circuits in terms of differences between the data output timings of said plurality of transmission circuits and the standard timing indicated by said standard signal.

10. A memory data output method as set forth in claim 9, wherein said monitoring the data output timing step includes the steps of:

selectively outputting one of a counting up signal and a counting down signal for each of said plurality of transmission circuits based upon one of the differences monitored for each of said plurality of transmission circuits, wherein said adjusting step is performed by use of an UP/DOWN counter provided for each transmission circuit and responding to said one of said count up signal and said count down signal provided for each transmission circuit, wherein each of said transmission circuits comprises a variable delay circuit for delaying the data read out to the corresponding data bus with a delay time corresponding to a count value of the corresponding UP/DOWN counter;

wherein said step of feeding a read address is repeated at different times so that said monitoring step repeats outputting of one of a count up signal and a count down signal for each of said plurality of transmission circuits.

11. A memory data output method as set forth in claim 10, wherein said control step further comprises the steps of:

outputting an early signal and a delayed signal, which are shifted by a constant time period from said standard signal, and wherein said monitoring the data output timings step includes a step of:

generating a count-up signal or a count-down signal from said standard signal, said early signal, said delayed signal and one of the data output by one of said transmission circuits.

12. A memory data output method as set forth in claim 8, further comprising the steps of:

receiving, by a plurality of flip-flops, the outputs of said plurality of transmission circuits in response to identical operating clocks of said processor and feeding the received signals to said processor, wherein said monitoring the individual data output timings step includes the step of:

detecting the timings of changes of outputs of said flip-flops.

13. A data processing system comprising:

a processor;

a plurality of memories;

an address bus for transmitting an address fed from said processor to said plurality of memories;

a plurality of data buses provided individually for said plurality of memories for transmitting a plurality of data fed from said processor in parallel to said plurality of memories and for transmitting a plurality of data read out of said plurality of memories in parallel to said processor; and a plurality of transmission circuits provided individually for said plurality of memories and capable of controlling delay times for feeding a plurality of data, which are read out of said plurality of memories to said plurality of data buses, with a delay to said processor.

14. A data processing system as set forth in claim 13, further comprising:

a control circuit for determining individual delay times of said plurality of transmission circuits so that the plurality of data read out of said plurality of memories for an identical address fed from said processor reach said processor within a predetermined time difference.

15. A data processing system as set forth in claim 14, wherein said control circuit comprises:

a circuit for controlling delay times of a plurality of variable delay circuits in response to data output timings of said plurality of transmission circuits for the plurality of data read out of said plurality of memories for the identical address fed from said processor change.

16. A data processing system as set forth in claim 14, wherein said control circuit comprises:

a circuit for controlling individual delay times of a plurality of transfer circuits so that the plurality of data read out of said plurality of memories for the identical address fed from said processor may individually reach said processor after a predetermined time has elapsed after said address is sent out to said address bus.

17. A data processing system as set forth in claim 15, wherein said control circuit further comprises:

means for feeding a read address to said plurality of memories so as to determine the delay times of said plurality of transmission circuits;

a plurality of monitor means for monitoring the individual timings at which the plurality of data read out of said plurality of memories for said fed read address reach said processor through said plurality of transmission circuits; and means for determining the individual delay times of said plurality of transmission circuits in accordance with the monitor results of said plurality of monitor means.

18. A data processing system as set forth in claim 17, wherein said delay time determining means comprises:

means for generating a standard signal indicating the standard timing, at which said plurality of data should reach said processor through said plurality of transmission circuits;

means for changing the individual delay times of said plurality of transmission circuits based upon the difference between timings at which said plurality of data reach said processor, said timings being detected by said plurality of monitor means, and the standard timing indicated by said standard signal; and means for repeating feeding of the address by said address feeding means, the monitoring by said plurality of monitor means and changing of the individual delay times by said delay time changing means until the plurality of data read out of said plurality of memories reaches said processor within a predetermined time difference.

19. A data processing system as set forth in claim 18, wherein each of said plurality of monitor means comprises a circuit for outputting a signal for counting up or down a delay time for each transmission circuit, wherein said delay time changing means includes an UP/DOWN counter for each transmission circuit, responding to the counting up or down signal outputted by the corresponding one of said plurality of monitor means, and wherein each of said transmission circuits comprises a variable delay circuit for delaying the data read out to the corresponding data bus with a delay time different in dependence upon the output of the corresponding UP/DOWN counter.

20. A data processing system as set forth in claim 19, wherein said control circuit further comprises:

means for outputting an early signal and a delayed signal, which are shifted by a constant time period from said standard signal, and wherein said means for outputting the counting up or down signal comprises:

a circuit for generating a count-up signal or a count-down signal from said standard signal, an early signal, a delayed signal and the timing at which the data read out through the corresponding transmission circuit reaches said processor.

21. A data processing system as set forth in claim 14, wherein said plurality of transmission circuits and said control circuit are included in the same LSI as said processor.

22. A data processing system as set forth in claim 17, further comprising:

a plurality of flip-flops for receiving the outputs of said plurality of transmission circuits in response to the identical operating clocks of said processor and feeding the fetched signals to said processor, wherein each of said plurality of monitor means comprises:

means for detecting a changing timing of an output of one of said flip-flops for receiving the outputs of the corresponding transmission circuits, to detect the timing at which the data reach said processor through said transmission circuits.

23. A data processing system comprising:

a circuit for outputting an address signal in synchronism with a clock signal;

at least one memory LSI for outputting a data signal in response to said address signal; and a flip-flop for receiving the data signal outputted by said memory LSI, wherein the improvement comprises:

means for adjusting the time period for said data signal to reach said flip-flop by delaying it.

24. A data processing system as set forth in claim 23, wherein said adjusting means is controlled by a control signal.

25. A data processing system as set forth in claim 24, further, comprising:

means for storing said control signal.

26. A data processing system as set forth in claim 25, wherein said storing means, said flip-flop and said adjusting means are packaged in a common LSI.

27. A data processing system as set forth in any of the claims 24 to 26, further comprising:

means for generating said control signal automatically.

28. A data processing system as set forth in claim 27, wherein said generating means comprises:

means for deciding whether or not a change timing of the output of said flip-flop and a predetermined timing are within a predetermined difference.

29. A data processing system as set forth in either of the claim 27, wherein said generating means has means for changing a value of at least one of a plurality of bits of said address signal to provide different addresses to said LSI memory and means for causing said adjusting means to adjust the time periods for different data signals provided by said LSI memory for said different addresses to reach said flip-flop.

30. A data processing system as set forth in either of the claim 28, wherein said generating means has means for changing a value of at least one of a plurality of bits of said address signal to provide different addresses to said LSI memory and means for causing said adjusting means to adjust the time periods for different data signals provided by said LSI memory for said different addresses to reach said flip-flop.

31. A data processing system as set forth in any of the claims 23 to 26, further comprising:

means for changing, after said adjusting, a time difference between the timing at which said address signal is outputted and the timing at which said flip-flop receives said data signal; and means for causing said adjusting means to repeat adjustment of said time period after said changing.

32. A data processing system as set forth in claim 27, further comprising:

means for changing, after said adjusting, a time difference between the timing at which said address signal is outputted and the timing at which said flip-flop receives said data signal; and means for causing said adjusting means to repeat adjustment of said time period after said changing.

33. A data processing system as set forth in claim 28, further comprising:

means for changing, after said adjusting, a time difference between the timing at which said address signal is outputted and the timing at which said flip-flop receives said data signal; and means for causing said adjusting means to repeat adjustment of said time period after said changing.

34. A data processing system as set forth in claim 29, further comprising:

means for changing, after said adjusting a time difference between the timing at which said address signal is outputted and the timing at which said flip-flop receives said data signal; and means for causing said adjusting means to repeat adjustment of said time period after said changing.

35. A data processing system as set forth in any of the claims 23 to 26, wherein said adjusting means includes:

a synchronizing circuit for shifting the timing at which said data signal provided by said LSI memory reaches said flip-flop by an amount dependent upon a combination of a plurality of clocks applied thereto.

36. A data processing system as set forth in claim 27, wherein said adjusting means includes:

a synchronizing circuit for shifting the timing at which said data signal provided by said LSI memory reaches said flip-flop by an amount dependent upon a combination of a plurality of clocks applied thereto.

37. A data processing system as set forth in claim 28, wherein said adjusting means includes:

a synchronizing circuit for shifting the timing at which said data signal provided by said LSI memory reaches said flip-flop by an amount dependent upon a combination of a plurality of clocks applied thereto.

38. A data processing system as set forth in claim 29, wherein said adjusting means includes:

a synchronizing circuit for shifting the timing at which said data signal provided by said LSI memory reaches said flip-flop by an amount dependent upon a combination of a plurality of clocks applied thereto.

39. A data processing system as set forth in claims 30, wherein said adjusting means includes:

a synchronizing circuit for shifting the timing at which said data signal provided by said LSI memory reaches said flip-flop by an amount dependent upon a combination of a plurality of clocks applied thereto.

40. A data processing system as set forth in claim 31, wherein said adjusting means includes:

a synchronizing circuit for shifting the timing at which said data signal provided by said LSI memory reaches said flip-flop by an amount dependent upon a combination of a plurality of clocks applied thereto.

41. A data processing system as set forth in claim 23, wherein said adjusting means comprises:

a variable delay circuit.

42. A data processing system as set forth in claim 23, wherein said LSI memory comprises: means for adjusting the timings at which output signals area provided by said LSI memory, means for detecting the timing when the address signal has changed; and means for supplying a control signal to said arranging means when a predetermined time elapses after said address signal has been outputted to said LSI memory wherein said adjusting means includes means for generating a data signal in response to said control signal and for providing said generated data signal in place of reading a data signal held at a location designated by said address signal within said LSI memory.

43. A data processing system as set forth in claim 42, further comprising:

means for preventing said supplying means from supplying said control signal when another address is outputted by said outputting means to said LSI memory after adjusting by said adjusting means is over;

wherein said adjusting means includes means for providing a data signal read out from a location within said LSI memory designated by said another address.

44. Apparatus, comprising:

a data processing system which comprises:

a processor, a plurality of memories, an address bus for transmitting addresses fed from said processor to said plurality of memories, and a plurality of data buses provided individually for said plurality of memories for transmitting a plurality of data fed from said processor in parallel to said plurality of memories and for transmitting a plurality of data read out of said plurality of memories in parallel to said processor; and a memory data output circuit for outputting data read out from said plurality of memories at substantially the same time, said memory data output circuit comprises:

a plurality of transmission circuits provided individually for said plurality of memories and capable of controlling delay time for feeding a plurality of data, which are read out of said plurality of memories to said plurality of data buses, with a delay to said processor.

45. A data processing system comprising:

a processor;

a plurality of memories;

an address bus for transmitting addresses fed from said processor to said plurality of memories;

a plurality of data buses provided individually for said plurality of memories for transmitting a plurality of data fed from said processor in parallel to said plurality of memories and for transmitting a plurality of data read out of said plurality of memories in parallel to said processor; and a memory data output circuit for outputting data read out from said plurality of memories at substantially the same time, said memory data output circuit comprises:

a plurality of transmission circuits provided individually for said plurality of memories and capable of controlling delay times for feeding a plurality of data, which are read out of said plurality of memories to said plurality of data buses, with a delay to said processor.

46. A data processing system comprising:

a processor;

a plurality of memories;

an address bus for transmitting addresses fed from said processor to said plurality of memories;

a plurality of data buses provided individually for said plurality of memories for transmitting a plurality of data fed from said processor in parallel to said plurality of memories and for transmitting a plurality of data read out of said plurality of memories in parallel to said processor; and a memory data output circuit for outputting data read out from said plurality of memories at substantially the same time, said memory data output circuit comprises:

a plurality of transmission circuits provided individually for said plurality of memories for transmitting from said plurality of memories via said plurality of data buses to said processor a plurality of data read out of said plurality of memories with adjustable delay times, and a control circuit which adjusts delay times of said plurality of transmission circuits in response to data output timings of said plurality of transmission circuits at which the plurality of data read out of said plurality of memories are provided by said plurality of transmission circuits.

* * * * *